United States Patent
Jang et al.

(10) Patent No.: US 11,239,363 B2
(45) Date of Patent: Feb. 1, 2022

(54) SEMICONDUCTOR DEVICES

(71) Applicant: SAMSUNG ELECTRONICS CO., LTD., Suwon-si (KR)

(72) Inventors: Sung Uk Jang, Suwon-si (KR); Ki Hwan Kim, Suwon-si (KR); Su Jin Jung, Suwon-si (KR); Bong Soo Kim, Suwon-si (KR); Young Dae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/598,012

(22) Filed: Oct. 10, 2019

(65) Prior Publication Data

US 2020/0220015 A1  Jul. 9, 2020

(30) Foreign Application Priority Data

Jan. 8, 2019 (KR) .................. 10-2019-0002425
Jan. 25, 2019 (KR) .................. 10-2019-0009967
Jun. 11, 2019 (KR) .................. 10-2019-0068894

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/02521* (2013.01); *H01L 21/02603* (2013.01);
(Continued)

(58) Field of Classification Search
CPC ......... H01L 29/06; H01L 29/08; H01L 29/24; H01L 29/66; H01L 29/78; H01L 29/7848; H01L 29/7851; H01L 29/78618; H01L 29/78696; H01L 29/0673; H01L 29/0847; H01L 29/42392; H01L 29/66546;
(Continued)

(56) References Cited

U.S. PATENT DOCUMENTS 7,687,337 B2   3/2010   Zhang et al.
7,718,500 B2 *  5/2010   Chong ............ H01L 21/823814
                                                  438/300
(Continued)

OTHER PUBLICATIONS

Office action received in copending U.S. Appl. No. 16/708,717 dated Nov. 3, 2020.
(Continued)

*Primary Examiner* — Chuong A Luu
(74) *Attorney, Agent, or Firm* — Lee IP Law, P.C.

(57) ABSTRACT

A semiconductor device including an active region extending in a first direction on a substrate; a gate structure intersecting the active region and extending in a second direction on the substrate; and a source/drain region on the active region and at least one side of the gate structure, wherein the source/drain region includes a plurality of first epitaxial layers spaced apart from each other in the first direction, the plurality of first epitaxial layers including first impurities of a first conductivity type; and a second epitaxial layer filling a space between the plurality of first epitaxial layers, the second epitaxial layer including second impurities of the first conductivity type.

20 Claims, 18 Drawing Sheets

(51) Int. Cl.
*H01L 29/08* (2006.01)
*H01L 29/06* (2006.01)
*H01L 29/423* (2006.01)
*H01L 29/786* (2006.01)
*H01L 21/02* (2006.01)
*H01L 29/24* (2006.01)

(52) U.S. Cl.
CPC .... *H01L 21/02636* (2013.01); *H01L 29/0673* (2013.01); *H01L 29/0847* (2013.01); *H01L 29/24* (2013.01); *H01L 29/42392* (2013.01); *H01L 29/66545* (2013.01); *H01L 29/66636* (2013.01); *H01L 29/66742* (2013.01); *H01L 29/66795* (2013.01); *H01L 29/7851* (2013.01); *H01L 29/78618* (2013.01); *H01L 29/78696* (2013.01)

(58) Field of Classification Search
CPC ......... H01L 29/66636; H01L 29/66742; H01L 29/66795; H01L 29/786; H01L 21/02; H01L 21/02521; H01L 21/02636; H01L 21/02603
USPC ........................................................ 257/190
See application file for complete search history.

(56) References Cited

U.S. PATENT DOCUMENTS

| | | | |
|---|---|---|---|
| 8,299,453 B2 | 10/2012 | Zhu | |
| 8,785,285 B2 | 7/2014 | Tsai et al. | |
| 9,034,741 B2 | 5/2015 | Adam et al. | |
| 9,595,597 B1 | 3/2017 | Basker et al. | |
| 9,673,324 B1 | 6/2017 | Wu et al. | |
| 9,853,129 B2 | 12/2017 | Bauer et al. | |
| 9,923,081 B1 | 3/2018 | Bao et al. | |
| 9,941,405 B2 | 4/2018 | Kittl et al. | |
| 9,997,613 B2 | 6/2018 | Chang et al. | |
| 10,090,147 B2 | 10/2018 | Yan et al. | |
| 10,109,533 B1 | 10/2018 | Xie et al. | |
| 10,177,227 B1 | 1/2019 | Yoshida et al. | |
| 2002/0045317 A1 | 4/2002 | Oishi et al. | |
| 2005/0280098 A1* | 12/2005 | Shin | H01L 29/66628 257/371 |
| 2013/0234203 A1* | 9/2013 | Tsai | H01L 29/66795 257/190 |
| 2017/0110554 A1 | 4/2017 | Tak | |
| 2017/0317169 A1 | 11/2017 | Bentley et al. | |
| 2018/0040696 A1 | 2/2018 | Li et al. | |
| 2018/0114834 A1 | 4/2018 | Cheng et al. | |
| 2018/0175167 A1 | 6/2018 | Reboh et al. | |
| 2018/0294331 A1 | 10/2018 | Cho et al. | |
| 2018/0331232 A1 | 11/2018 | Frougier et al. | |
| 2018/0366544 A1 | 12/2018 | Chang et al. | |

OTHER PUBLICATIONS

Notice of Allowance received in co pending related U.S. Appl. No. 16/708,717, dated Feb. 4, 2021.

* cited by examiner

SEMICONDUCTOR DEVICES

CROSS-REFERENCE TO RELATED APPLICATION

Korean Patent Application No. 10-2019-0002425 filed on Jan. 8, 2019, Korean Patent Application No. 10-2019-0009967 filed on Jan. 25, 2019, and Korean Patent Application No. 10-2019-0068894 filed on Jun. 11, 2019 in the Korean Intellectual Property Office, and entitled: "Semiconductor Devices," is incorporated by reference herein in its entirety.

BACKGROUND

1. Field

Embodiments relate to a semiconductor device.

2. Description of the Related Art

With increasing demand for high performance, high speed, multifunctionality, and the like, of a semiconductor device, integration density of a semiconductor device has been increased. To meet the demand for high integration density of a semiconductor device, a semiconductor device having fine patterns has been developed, and patterns may have fine widths or fine spacing distances therebetween.

SUMMARY

The embodiments may be realized by providing a semiconductor device including an active region extending in a first direction on a substrate; a gate structure intersecting the active region and extending in a second direction on the substrate; and a source/drain region on the active region and at least one side of the gate structure, wherein the source/drain region includes a plurality of first epitaxial layers spaced apart from each other in the first direction, the plurality of first epitaxial layers including first impurities of a first conductivity type; and a second epitaxial layer filling a space between the plurality of first epitaxial layers, the second epitaxial layer including second impurities of the first conductivity type.

The embodiments may be realized by providing a semiconductor device including an active region extending in a first direction on a substrate; a plurality of channel layers on the active region, the plurality of channel layers being spaced apart from each other in a third direction perpendicular to the first direction; a gate structure on the substrate intersecting the active region and the plurality of channel layers and extending in a second direction, the gate structure surrounding the plurality of channel layers; and a source/drain region on the active region and at least one side of the gate structure, the source/drain region being in contact with the plurality of channel layers, wherein the source/drain region includes a plurality of first epitaxial layers on side surfaces of the plurality of channel layers facing one another in the first direction, each of the plurality of first epitaxial layers including first impurities of a first conductivity type; and a second epitaxial layer filling a space between the plurality of first epitaxial layers and including second impurities of the first conductivity type.

The embodiments may be realized by providing a semiconductor device including an active structure extending in a first direction on a substrate and having channel regions; gate structures intersecting the channel regions and extending in a second direction; and source/drain regions on both sides of the gate structures, wherein each of the source/drain regions includes a first semiconductor layer including first impurities in a first concentration; and a plurality of second semiconductor layers separated from each other to be in contact with the channel regions, respectively, between the first semiconductor layer and the channel regions, and including second impurities in a second concentration that is lower than the first concentration.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
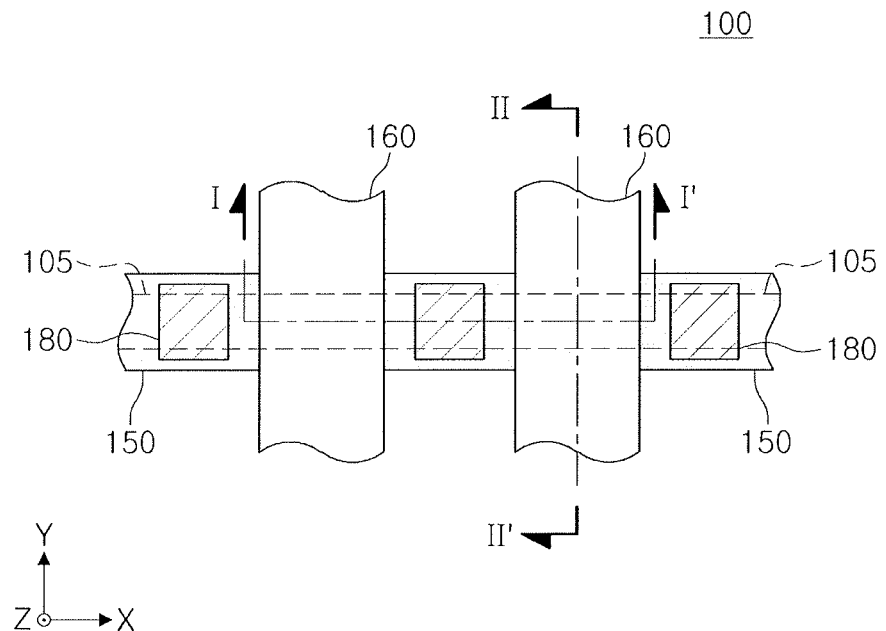
FIG. 1 illustrates a plan view of a semiconductor device according to an example embodiment.

FIG. 1 illustrates a plan view of a semiconductor device according to an example embodiment.

Figure 2:
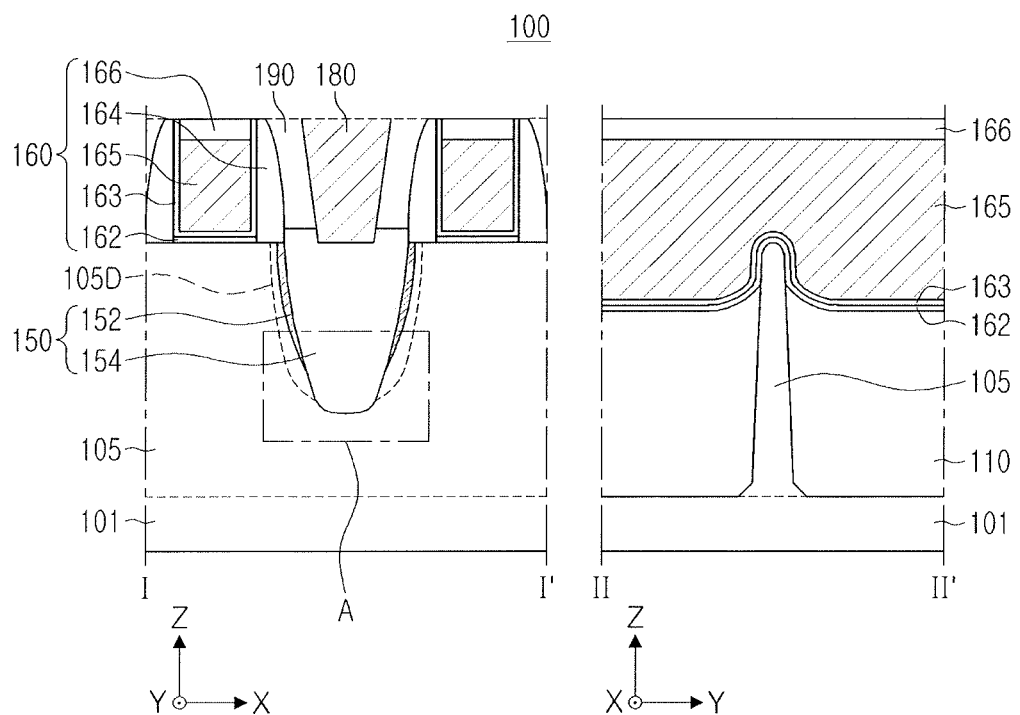
FIG. 2 illustrates a cross-sectional view of a semiconductor device according to an example embodiment.

FIG. 2 illustrates a cross-sectional view of a semiconductor device according to an example embodiment. For example, FIG. 2 illustrates cross-sectional views of the semiconductor device of FIG. 1 taken along lines I-I' and II-II'. For ease of description, only main elements of the semiconductor device are illustrated in FIGS. 1 and 2.

Referring to FIGS. 1 and 2, a semiconductor device 100 may include a substrate 101, an active region 105, a device isolating layer 110, source/drain regions 150, gate structures 160, contact plugs 180, and interlayer insulating layers 190. The semiconductor device 100 may include FinFET device, transistors in which the active region 105 has a fin structure. The FinFET devices may include transistors around the active region 105 and the gate structures 160 intersecting each other. For example, the transistors may be NMOS transistors.

The substrate 101 may have an upper surface extending in an x direction and a y direction (e.g., may be in a plane formed by the x direction and y direction). The substrate 101 may include a semiconductor material, e.g., a IV group semiconductor, a III-V group compound semiconductor, or a II-VI group compound semiconductor. In an implementation, the IV group semiconductor may include, e.g., silicon, germanium, or silicon-germanium. The substrate 101 may be provided as, e.g., a bulk wafer, an epitaxial layer, a silicon-on-insulator (SOI) layer, a semiconductor-on-insulator (SeOI) layer, or the like.

The device isolating layers 110 may define the active region 105 on the substrate 101. The device isolating layers 110 may be formed through, e.g., a shallow trench isolation (STI) process. In an implementation, the device isolating layer 110 may further include a region further extending towards a lower portion of the substrate 101. In an implementation, the device isolating layers 110 may have a curved upper surface, a level (e.g., height relative to the substrate 101 in a z direction) of which may increase towards the active region 105. The device isolating layers 110 may be formed of an insulating material. The device isolating layer 110 may be formed of, e.g., an oxide, a nitride, or a combination thereof.

The active region 105 may be defined by the device isolating layer 110 and may extend in a first direction, e.g., the x direction, in or on the substrate 101. The active region 105 may protrude from the substrate 101 (e.g., in the z direction). An upper end of the active region 105 may protrude away from or above an upper surface of the device isolating layer 110 by a certain height (e.g., in the z direction). In an implementation, the active region 105 may be a portion of the substrate 101 or may include an epitaxial layer grown from the substrate 101. In or at both side regions of the gate structures 160, a portion of the active region 105 on the substrate 101 may be recessed, and the source/drain regions 150 may be in the recessed active region 105.

The active region 105 may include doping regions 105D including impurities. The doping regions 105D may be in an external region (e.g., at an outer side) of the recess region in which the source/drain regions 150 are disposed or contained, such that the doping regions 105D may be in contact with the source/drain regions 150. The doping regions 105D may include impurities of a same conductivity type as a conductivity type of impurities included in the source/drain regions 150, and in a lower concentration than a concentration of impurities included in the source/drain regions 150. In an implementation, the doping regions 105D may a portion of the source/drain regions 150. In an implementation, the doping regions 105D may include first impurities, e.g., arsenic (As), and the arsenic (As) may be doped in a concentration of about $1 \times 10^{15}/cm^3$ to $2 \times 10^{15}/cm^3$. The doping regions 105D in contact with a single source/drain region 150 may be spaced apart from each other in one direction, e.g., the x direction, and may be on both side walls of the source/drain region 150. In an implementation, the doping regions 105D may be omitted.

The source/drain regions 150 may be in the recess regions in which the active region 105 is recessed at both sides of the gate structures 160. The recess region may extend in the x direction, e.g., between the gate structures 160, and may have internal side walls on both ends taken in the x direction and a bottom surface between the internal side walls. The source/drain regions 150 may be source regions or drain regions of transistors. Upper surfaces of the source/drain regions 150 may be on a level similar to or higher than (e.g., farther from the substrate 101 than) a level of lower surfaces of the gate structures 160. Relative heights of the source/drain regions 150 and the gate structures 160 may be varied in example embodiments. In an implementation, the source/drain regions 150 may have an elevated source/drain form in which upper surfaces of the source/drain regions 150 are higher than lower (e.g., substrate-facing) surfaces of the gate structures 160, e.g. the gate electrodes 165.

A cross-sectional view of the source/drain region 150 taken in the y direction may have, e.g., a pentagonal shape, a hexagonal shape, or shapes similar to a pentagon or a hexagon. In an implementation, the source/drain regions 150 may have various shapes, and may have a shape of one of, e.g., a polygon, a circle, and a rectangle. An upper surface of a cross-sectional view of the source/drain region 150 taken in the x direction may be planar as illustrated in FIG. 2, and a lower portion of the upper surface may have a curved shape similar to a portion or section of a circle, a portion or section of an oval, or the like. The shapes described above may be varied in example embodiments depending on a distance between adjacent gate structures 160, a height of the active region 105, and the like.

The source/drain regions 150 may include first epitaxial layers 152 and a second epitaxial layer 154 layered in order. The second epitaxial layer 154 may fill a space between the first epitaxial layers 152. The first epitaxial layers 152 and the second epitaxial layer 154 may include silicon (Si), and may also include different elements and/or different concentrations of impurities. The number of the epitaxial layers included in the source/drain region 150 may be varied in example embodiments.

The first epitaxial layer 152 may include impurities in a concentration that is higher than a concentration of impurities included in the doping regions 105D. The impurities may be the first impurities included in the doping regions 105D, or may be second impurities different from the first impurities. In an implementation, the first epitaxial layer 152 may include impurities of a first conductivity type, e.g., arsenic (As) and/or phosphorus (P), and may be, e.g., an SiAs layer, an SiP layer, an SiPC layer, or an SiGeP layer. A concentration of the impurities may be, e.g., about $2 \times 10^{20}/cm^3$ to about $8 \times 10^{20}/cm^3$. The first conductivity may be, e.g., n-type conductivity. The first epitaxial layer 152 may be a layer having an epitaxially grown crystal structure, and may further include a seed layer for growth.

The first epitaxial layer 152 may be on the doping regions 105D on both side walls of the recess region (e.g., opposite to one another in the x direction). For example, the first epitaxial layers 152 may be spaced apart from each other on both internal side walls of the source/drain regions 150 in an extension direction of the active region 105 between adjacent gate structures 160, similarly to the doping regions 105D. In an implementation, a thickness of the first epitaxial layer 152 may be, e.g., about 3 nm to about 5 nm. The first epitaxial layers 152 may be spaced apart from each other on both internal side walls of the source/drain regions 150 as described above along with the doping regions 105D, and a short channel effect caused by diffusion of impurities of the second epitaxial layer 154 may be effectively prevented. For example, the first impurities of the first epitaxial layer 152 may include an element having a size greater than a size of an element of the second impurities included in the second epitaxial layer 154. For example, the diffusion of the second impurities may be more effectively prevented, thereby preventing a short channel effect.

The second epitaxial layer 154 may completely fill the recess region, and may be a region including impurities in a higher concentration than a concentration of impurities included in the first epitaxial layer 152. The second epitaxial layer 154 may be an epitaxially grown layer, and may have a crystal structure connected to the first epitaxial layer 152 in series. The first epitaxial layer 152 and the second epitaxial layer 154 may be epitaxial layers, and damage to a film caused by an ion implantation process if the first epitaxial layer 152 and the second epitaxial layer 154 were doping regions may be prevented, thereby improving electrical properties of the semiconductor device 100.

The impurities included in the second epitaxial layer 154 may be the same as or different from the impurities included in the first epitaxial layer 152. For example, the first epitaxial layer 152 may include the first impurities of a first conductivity type in a first concentration, and the second epitaxial layer 154 may include the second impurities of the same first conductivity type in a second concentration that is higher than the first concentration. In an implementation, the second epitaxial layer 154 may be an SiP layer including phosphorus (P), and a concentration of the impurities may be, e.g., about $3.1 \times 10^{21}/cm^3$ to about $3.9 \times 10^{21}/cm^3$. In an implementation, the doping regions 105D may include arsenic (As), the first epitaxial layer 152 may be an SiAs layer, and the second epitaxial layer 154 may be an SiP layer. The second impurities of the second epitaxial layer 154 may be partially diffused into an adjacent first epitaxial layer 152 and doping regions 105D, and may be partially included in the first epitaxial layer 152 and the doping regions 105D. Similarly, the first impurities of the first epitaxial layer 152 may be partially diffused into an adjacent second epitaxial layer 154 and doping regions 105D and may be partially included in the second epitaxial layer 154 and the doping regions 105D. For example, the first epitaxial layer 152 may include a region in which a concentration of the first impurities is maximal, and the second epitaxial layer 154 may include a region in which a concentration of the second impurities is constant and higher than a concentration of the impurities included in the first epitaxial layer 152.

The second epitaxial layer 154 may be in contact with the active region 105 of the substrate 101 on a bottom surface of the recess region. For example, the second epitaxial layer 154 may be in a region from which the doping regions 105D and the first epitaxial layer 152 are or have been removed on a bottom surface of the recess region. The second epitaxial layer 154 may be a single layer in or between upper portions of the first epitaxial layers 152 spaced apart from each other in an extension direction of the active region 105. For example, in the semiconductor device 100, the second epitaxial layer 154 may be formed after removing the first epitaxial layer 152 in a central region of the source/drain region 150 taken in an extension direction of the active region 105. For example, a volume of the second epitaxial layer 154, a region including a relatively high concentration of impurities in the source/drain regions 150, may increase, and electrical properties of the semiconductor device 100 may further improve.

The gate structures 160 may intersect the active region 105 and may extend in one direction, e.g., they direction, in or on an upper portion of the active region 105. Channel regions of transistors may be formed in the active region 105 intersecting or underlying the gate structures 160. The "channel region" may refer to a region including a depletion region of a transistor, and may refer to a region of the active region 105 intersecting the gate structures 160 and adjacent to the gate structures 160. The gate structure 160 may include, e.g., a first gate dielectric layer 162, a second gate dielectric layer 163, a gate electrode 165, gate spacer layers 164, and a gate capping layer 166.

The first and second gate dielectric layers 162 and 163 may be between the active region 105 and the gate electrodes 165, and the first gate dielectric layer 162 may be (e.g., only) on a lower (e.g., substrate-facing) surface of the second gate dielectric layer 163 on lower surfaces of the gate electrodes 165, and the second gate dielectric layer 163 may cover lower surfaces and both side surfaces of the gate electrodes 165. In an implementation, one of the first and second gate dielectric layers 162 and 163 may be omitted. The first and second gate dielectric layers 162 and 163 may include, e.g., an oxide, a nitride, or a high-k material. The high-k material may refer to a dielectric material having a dielectric constant higher than a dielectric constant of a silicon oxide ($SiO_2$). The high-k material may be one of, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 165 may include a conductive material. For example, the gate electrode 165 may include a metal nitride material such as a titanium nitride film (TiN), a tantalum nitride film (TaN), or a tungsten nitride film (WN) and/or a metal material such as aluminum (Al), tungsten (W), molybdenum (Mo), or the like, or a semiconductor material such as a doped polysilicon. The gate electrode 165 may include multiple layers, e.g., two or more layers. The gate electrodes 165 may be separated from each other between at least portions of adjacent transistors depending on a configuration of the semiconductor device 100.

The gate spacer layers 164 may be on both side surfaces of the gate electrode 165. The gate spacer layers 164 may insulate the source/drain regions 150 from the gate electrode 165. In an implementation, the gate spacer layers 164 may have a multilayer structure. The gate spacer layers 164 may be formed of, e.g., an oxide, a nitride, an oxynitride, and/or a low-k material film.

The gate capping layer 166 may be in or on an upper portion of the gate electrode 165, and each of a lower surface and side surfaces of the gate capping layer 166 may be surrounded by the gate electrode 165 and the gate spacer layers 164.

The interlayer insulating layer 190 may cover the source/drain regions 150 and the gate structures 160 and to cover the device isolating layers 110. The interlayer insulating layers 190 may include one of an oxide, a nitride, and oxynitride, e.g., and may include a low-k material film.

The contact plug 180 may penetrate the interlayer insulating layer 190 and may be connected to the source/drain region 150, and may apply an electrical signal to the source/drain region 150. In an implementation, the contact plug 180 may be on the source/drain region 150 as illustrated in FIG. 1, and may have a length longer than a length of the source/drain region 150 in the y direction. In an implementation, the contact plug 180 may have a sloped side surface of which a width of a lower portion is less than a width of an upper portion in accordance with an aspect ratio. In an implementation, the contact plugs 180 may be recessed or may extend into the source/drain region 150 by a certain depth. In an implementation, the contact plugs 180 may not be recessed into the source/drain region 150, and may be in contact with an upper surface (e.g., a flat upper surface) of the source/drain region 150.

Figure 3A:
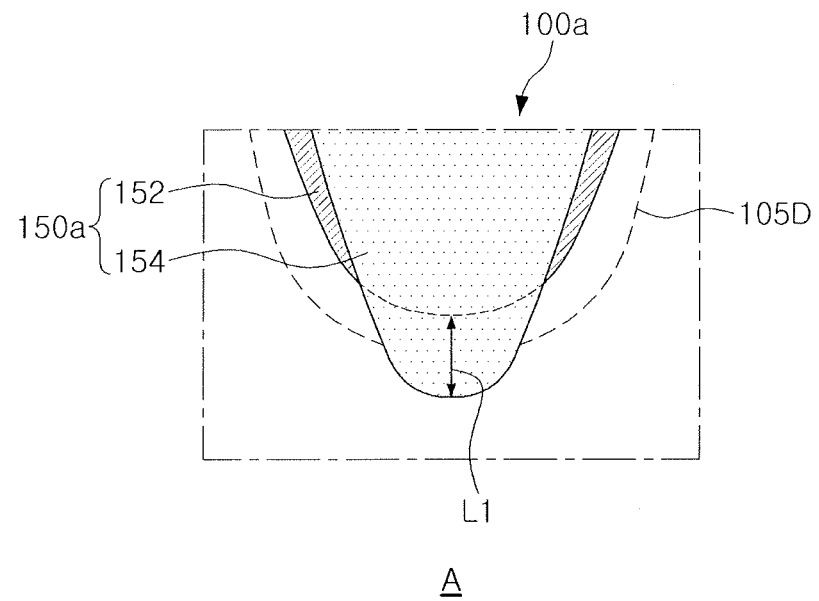
FIGS. 3A and 3B illustrate enlarged diagrams of a semiconductor device according to an example embodiment.
Figure 3B:
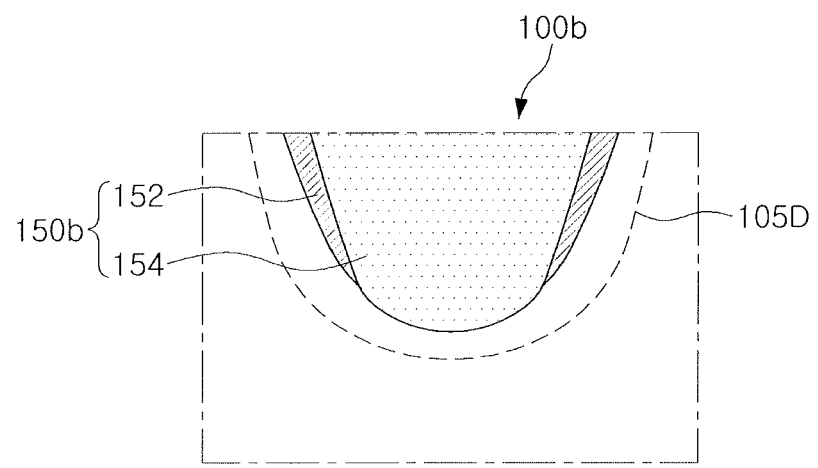

FIGS. 3A and 3B illustrate enlarged diagrams of a semiconductor device according to an example embodiment. FIGS. 3A and 3B illustrate regions corresponding to region "A" illustrated in FIG. 1 in magnified form.

Referring to FIG. 3A, in a semiconductor device 100a, a source/drain region 150a may have a form in which the second epitaxial layer 154 is recessed more deeply downwardly (e.g., closer to the substrate 101 in the z direction) than in the aforementioned example embodiment. The second epitaxial layer 154 may be on a region recessed deeper from a lower end of a recess region before first epitaxial layers 152 are formed, by a first length L1. For example, the second epitaxial layer 154 may further protrude downwardly from lower surfaces of the doping regions 105D. In an implementation, the first length L1 may be varied.

Referring to FIG. 3B, in a semiconductor device 100b, a source/drain region 150b may have a form in which the second epitaxial layer 154 is recessed less deeply downwardly than in the aforementioned example embodiment. For example, the doping regions 105D may not be divided to both sides (e.g., separated in the x direction) in or at a lower portion of the source/drain region 150b, and may form a single, continuous region. For example, the doping regions 105D may not be divided by the second epitaxial layer 154 in a lower portion of the source/drain region 150b. Also, impurities diffused from the first epitaxial layer 152 may remain in the active region 105 in contact with a lower end of the source/drain region 150b from which the first epitaxial layer 152 is removed.

Figure 4:
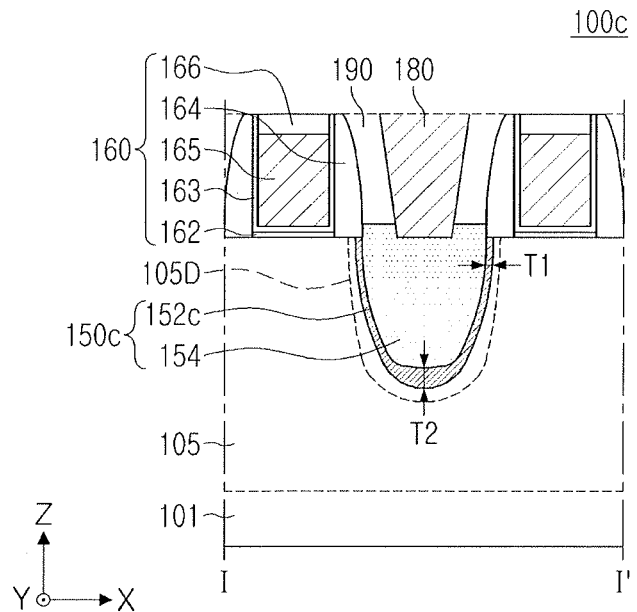
FIG. 4 illustrates a cross-sectional view of a semiconductor device according to an example embodiment.

FIG. 4 illustrates a cross-sectional diagram of a semiconductor device according to an example embodiment. FIG. 4 illustrates a region corresponding to the cross-section taken along line I-I' in FIG. 1.

Referring to FIG. 4, in a semiconductor device 100c, a source/drain region 150c may include first and second epitaxial layers 152c and 154, each integrated as a single continuous layer. Differently from the semiconductor device 100a illustrated in FIG. 2, in a lower portion of the second epitaxial layer 154, doping regions 105D may be a single layer, and first epitaxial layers 152c may be a single layer. A thickness of the first epitaxial layer 152c may be different, e.g., a thickness thereof on a side wall of a recess region (taken in the x direction) may be different from a thickness thereof on a bottom surface of the recess region (in which the source/drain region 150c is disposed). The first epitaxial layer 152c may have a first thickness T1 on a side wall of the recess region, and may have a second thickness T2 greater than the first thickness T1 on a bottom surface of the recess region. In an implementation, the second thickness T2 may be two or more times the first thickness T1. The above-described structure may be controlled by adjusting a type of a crystallographic plane of an active region 105 exposed through the recess region. A type of the crystallographic plane may refer to a crystallographic plane expressed by a Miller index.

Figure 5:
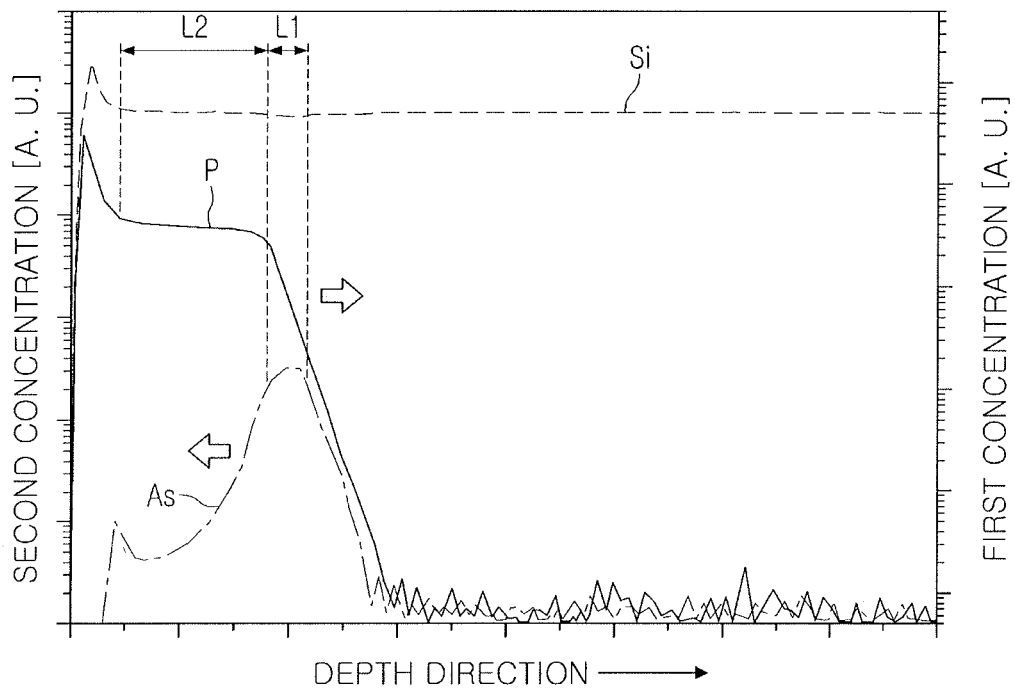
FIG. 5 illustrates a graph of a concentration of impurities of a source/drain region in a semiconductor device according to an example embodiment.

FIG. 5 illustrates a graph of a concentration of impurities of a source/drain region in a semiconductor device according to an example embodiment.

FIG. 5 illustrates a concentration of impurities of a source/drain region 150 of a semiconductor device 100c illustrated in FIG. 4, analyzed from an upper surface of the source/drain region 150 in a depth direction, e.g., the z direction toward the substrate 101. The analysis was conducted using secondary-ion mass spectrometry (SIMS), and the diagram illustrates an analysis result of an example in which a first epitaxial layers 152c is an SiAs layer including about $6.5 \times 10^{20}/cm^3$ of arsenic (As), and a second epitaxial layer 154 is an SiP layer including about $3.8 \times 10^{21}/cm^3$ of phosphorus (P). A first concentration of phosphorus (P) and a second concentration of arsenic (As) were determined with reference to different vertical axes on the right side and the left side, respectively, and each of the vertical axes are independent from each other.

As illustrated in the diagram, it may be interpreted that, in a region adjacent to a surface, a section L2 in which a concentration of phosphorus (P) is constant may be a region of the second epitaxial layer 154, and that, in a lower portion, a section L1 including a region in which a concentration of arsenic (As) has a maximum value may be a region of a first epitaxial layer 152c. For example, even when impurities are partially diffused to a peripheral region in the process of manufacturing the semiconductor device 100c, each of the regions of the first and second epitaxial layers 152c and 154 may be distinctly identified as illustrated in the diagram.

FIGS. 6A to 6G illustrate sectional views of stages in a method of manufacturing a semiconductor device in order according to an example embodiment. FIGS. 6A to 6G illustrate example embodiments of a method for manufacturing a semiconductor device illustrated in FIGS. 1 and 2, and illustrate regions corresponding to the regions illustrated in FIG. 2.

Figure 6A:
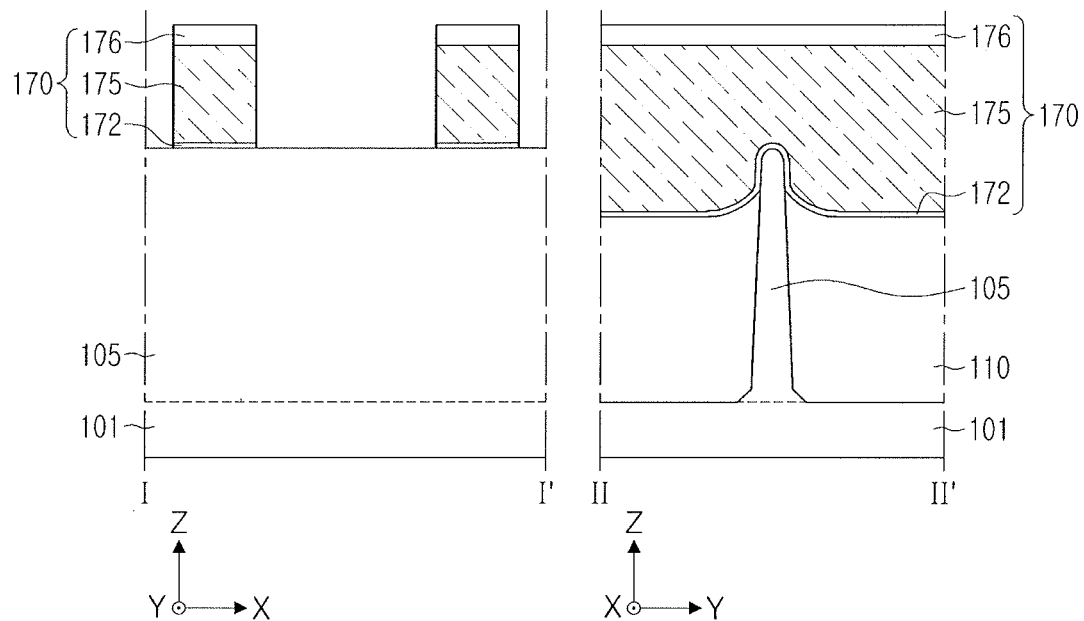
FIGS. 6A to 6G illustrate sectional views of stages in a method of manufacturing a semiconductor device in order according to an example embodiment.

Referring to FIG. 6A, an active region 105 may be defined by patterning a substrate 101, a device isolating layer 110 may be formed, and sacrificial gate structures 170 may be formed.

The active region 105 may be formed by forming trenches by anisotropic-etching the substrate 101 using a mask layer. The trench regions may have a relatively high aspect ratio, a width of the trench region may decrease downwardly, and the active region 105 may have a shape of which a width thereof (e.g., in the y direction) may decrease upwardly (e.g., a width in the y direction of the active region 105 proximate to the substrate 101 may be greater than a width in the y direction of the active region 105 distal to the substrate 101). The device isolating layer 110 may be formed by filling the trench regions with an insulating material and planarizing the trench regions along an upper surface of the active region 105.

The sacrificial gate structures 170 may be in or on the active region 105 in a line form intersecting the active region 105 and extending in the y direction. The sacrificial gate structures 170 may be in a region in which first and third gate dielectric layers 162 and 163 and a gate electrode 165 are disposed through a subsequent process as in the example illustrated in FIG. 2. The sacrificial gate structure 170 may include first and second sacrificial gate layers 172 and 175 and a mask pattern layer 176. The first and second sacrificial gate layers 172 and 175 may be patterned using the mask pattern layer 176.

In an implementation, the first and second sacrificial gate layers 172 and 175 may be an insulating layer and a conductive layer, respectively. In an implementation, the first and second sacrificial gate layers 172 and 175 may be integrated as a single layer. In an implementation, the first sacrificial gate layer 172 may include silicon oxide, and the second sacrificial gate layer 175 may include polysilicon. The mask pattern layer 176 may include silicon oxide and/or silicon nitride. A structure of the sacrificial gate structure 170 may be varied in example embodiments.

Figure 6B:
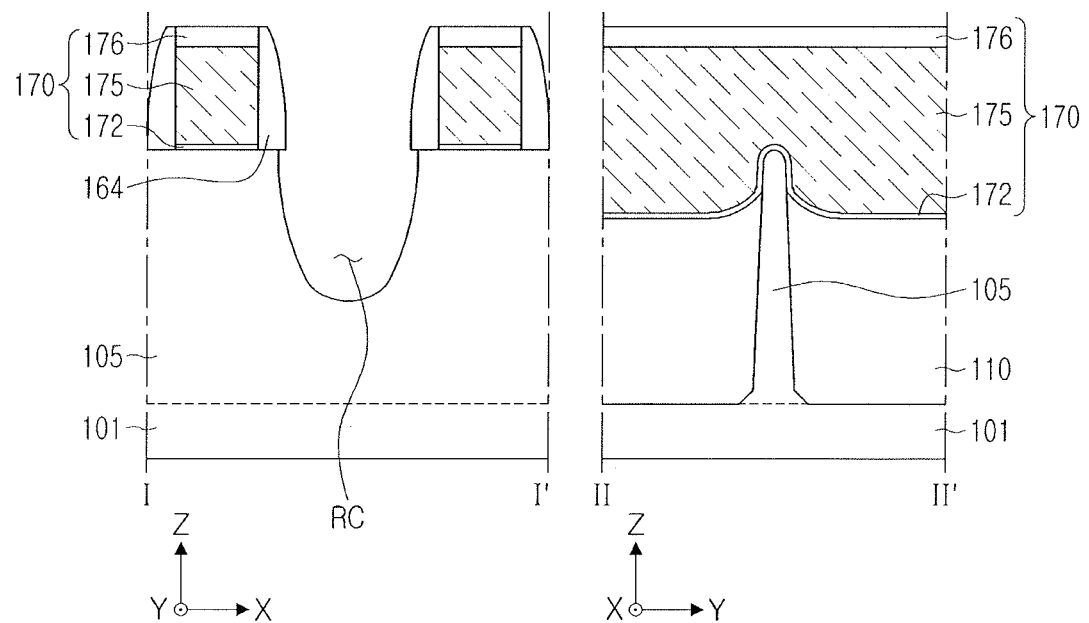

Referring to FIG. 6B, gate spacer layers 164 may be on both side walls of the sacrificial gate structure 170, and a recess region RC may be formed by recessing the active region 105 exposed between the sacrificial gate structures 170.

The gate spacer layers 164 may be on side surfaces of the sacrificial gate structure 170. The gate spacer layers 164 may be formed of a low-k material. For example, the gate spacer layers 164 may include one of SiO, SiN, SiCN, SiOC, SiON, and SiOCN.

The recess region RC may be formed by recessing the active region 105 from an upper surface by a certain depth (e.g., toward the substrate 101 in the z direction). For example, in the recessing process, the recess region RC may be formed by sequentially performing a dry etching process and a wet etching process. For example, in this process, the active region 105 may have a lower height in or adjacent to external regions or sides of the sacrificial gate structures 170 than in lower portions of the sacrificial gate structures 170. In an implementation, the recess region RC may have a form extending to or under lower portions of the gate spacer layers 164 and lower portions of the sacrificial gate structures 170. In an implementation, after the recessing process, a process for curing a surface of the recessed active region 105 may be performed.

Figure 6C:
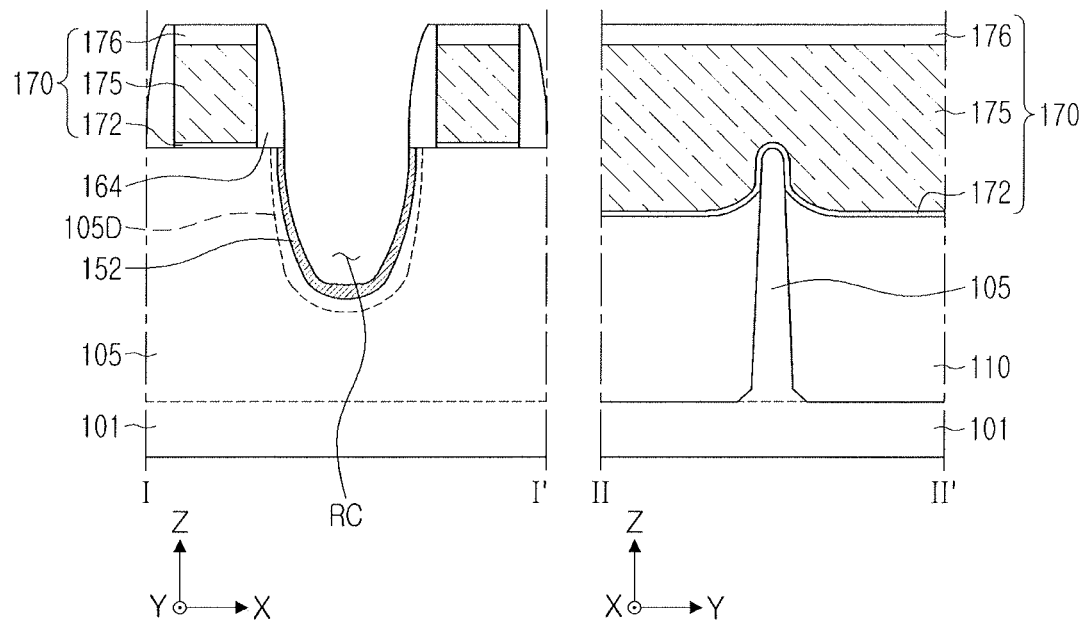

Referring to FIG. 6C, the doping region 105D of the source/drain region 150 may be formed by injecting impurities to the active region 105, and the first epitaxial layer 152 of the source/drain region 150 may be formed.

The doping region 105D may be formed by injecting impurities to the active region 105 using the sacrificial gate structures 170 and the gate spacer layers 164 as masks. The impurities may be, e.g., arsenic (As). The doping region 105D may be formed on an exposed upper surface of the active region 105 along a lower surface and side surfaces (e.g., inner surfaces) of the recess region RC.

The first epitaxial layer 152 may be grown from the active region 105 using, e.g., a selective epitaxial growth (SEG) process. The first epitaxial layer 152 may include first impurities by an in-situ doping process. The first epitaxial layer 152 may be an SiAs layer, an SiP layer, an SiPC layer, an SiC layer, or an SiGeP layer. A concentration of arsenic (As) and/or phosphorus (P) included in the first epitaxial layer 152 may be higher than a concentration of arsenic (As) included in the doping region 105D. The first epitaxial layer 152 may be formed along a lower surface and side surfaces of the recess region RC on the doping region 105D. The first epitaxial layer 152 may have a relatively greater thickness on or at a bottom surface of the recess region RC than on side surfaces, or may have a substantially uniform thickness on the side surfaces and the bottom surface depending on a crystallographic plane of the active region 105 exposed through the recess region RC.

Figure 6D:
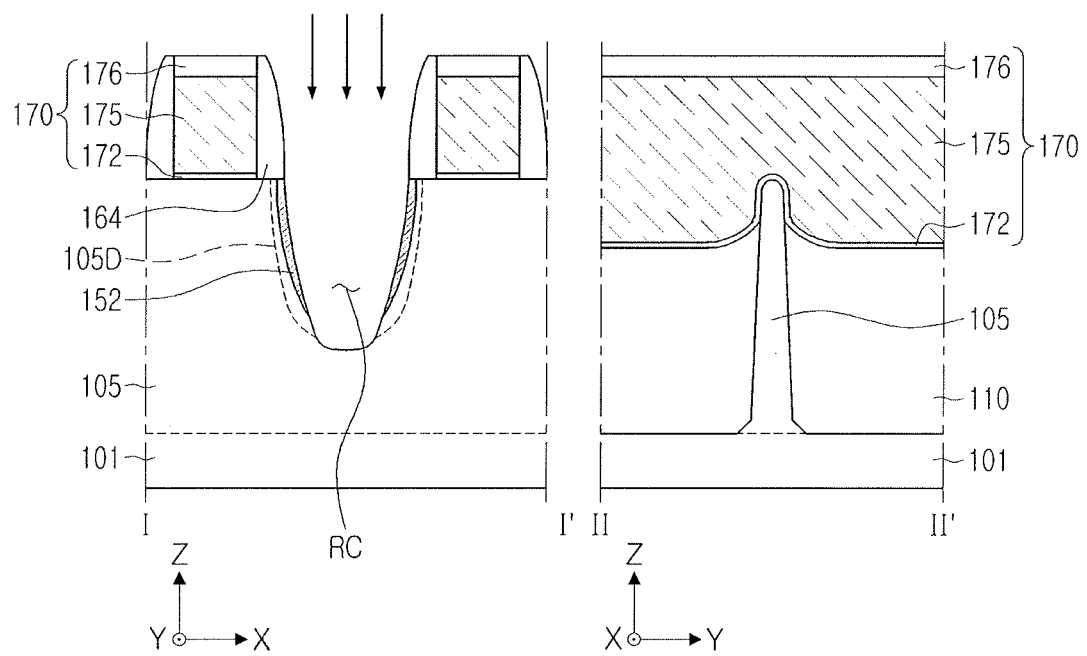

Referring to FIG. 6D, a portion of the doping region 105D and a portion of the first epitaxial layer 152 may be removed from a central (e.g., bottom) region of the recess region RC (taken in the x direction).

The process for removing the doping region 105D and the first epitaxial layer 152 may be performed using a mask layer or may be performed without using a mask layer. As the removing process, e.g., a dry etching process may be used. For example, the doping region 105D and the first epitaxial layer 152 may be removed from a bottom surface of the recess region RC, and the active region 105 of the substrate 101 may be exposed. Accordingly, the doping region 105D and the first epitaxial layer 152 may be divided to both sides of each of (e.g., may be separated from one another and on) internal walls of the recess region RC.

In the example embodiments in FIGS. 3A and 3B, the exposed active region 105 may be further recessed by a certain depth or may be less recessed during the removing process. In the example embodiment in FIG. 4, the above-described etching process may not be performed.

Figure 6E:
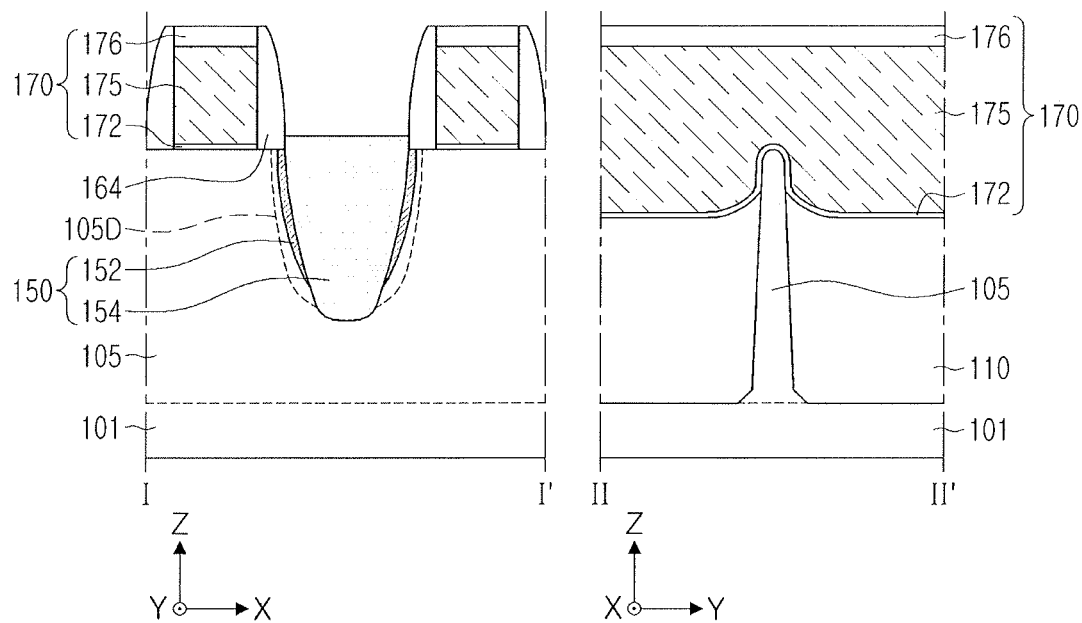

Referring to FIG. 6E, the second epitaxial layer 154 of the source/drain region 150 filling the recess region RC may be formed.

The second epitaxial layer 154 may be grown from the first epitaxial layer 152 using an SEG process. The second epitaxial layer 154 may include second impurities by an in-situ doping process. For example, the second epitaxial layer 154 may be an SiP layer. A concentration of phosphorus (P) included in the second epitaxial layer 154 may be higher than a concentration of arsenic (As) or phosphorus (P) included in the first epitaxial layer 152. For example, the source/drain region 150 may be formed.

The second epitaxial layer 154 may be formed along a bottom surface and side surfaces of the recess region RC on the first epitaxial layer 152. For example, the second epitaxial layer 154 may be in contact with the active region 105 in a central (e.g., bottom) region of the source/drain region 150. In an implementation, the second epitaxial layer 154 may be formed after portions of the doping region 105D and the first epitaxial layer 152 are removed from a central region of the source/drain region 150, and a volume of the second epitaxial layer 154 may be secured.

Figure 6F:
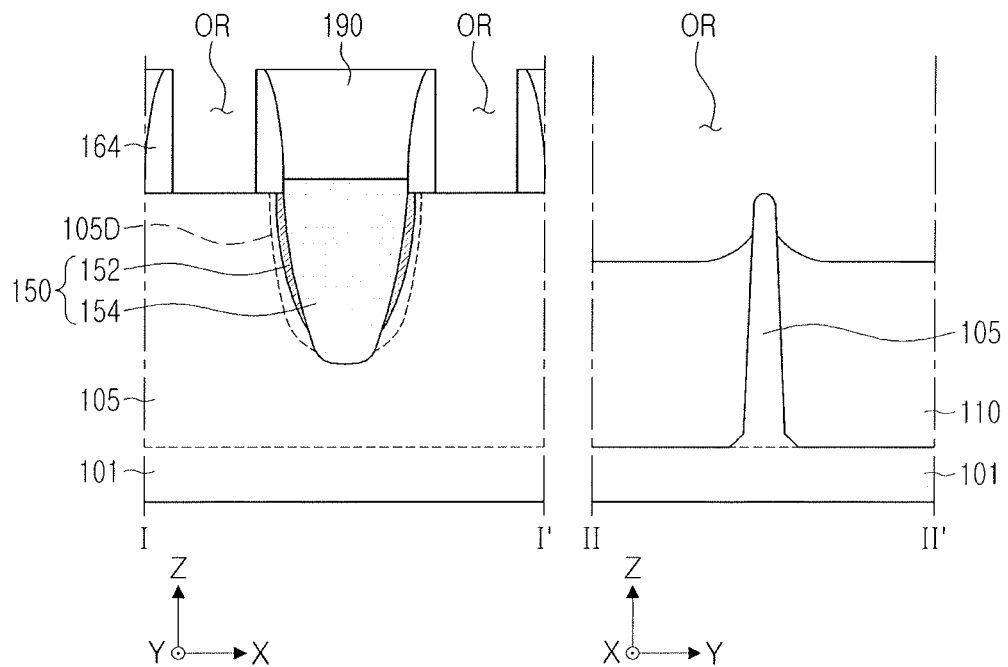

Referring to FIG. 6F, the interlayer insulating layer 190 may be formed on the source/drain region 150, and the sacrificial gate structure 170 may be removed.

The interlayer insulating layer 190 may be formed by depositing an insulating material to cover the source/drain regions 150, the sacrificial gate structure 170, and the gate spacer layers 164, and performing a planarizing process to expose an upper surface of the second sacrificial gate layer 175 or the mask pattern layer 176. In an implementation, in the planarizing process, the mask pattern layer 176 may be removed. The interlayer insulating layer 190 may include at least one of an oxide, a nitride, and an oxynitride, and may include a low-k material.

A remaining sacrificial gate structure 170 including the first and second sacrificial gate layers 172 and 175 may be selectively removed with respect to the active region 105 and the device isolating layer 110 in a lower portion, thereby forming openings OR. As the process for removing sacrificial gate structure 170, at least one of a dry etching process and a wet etching process may be used.

Figure 6G:
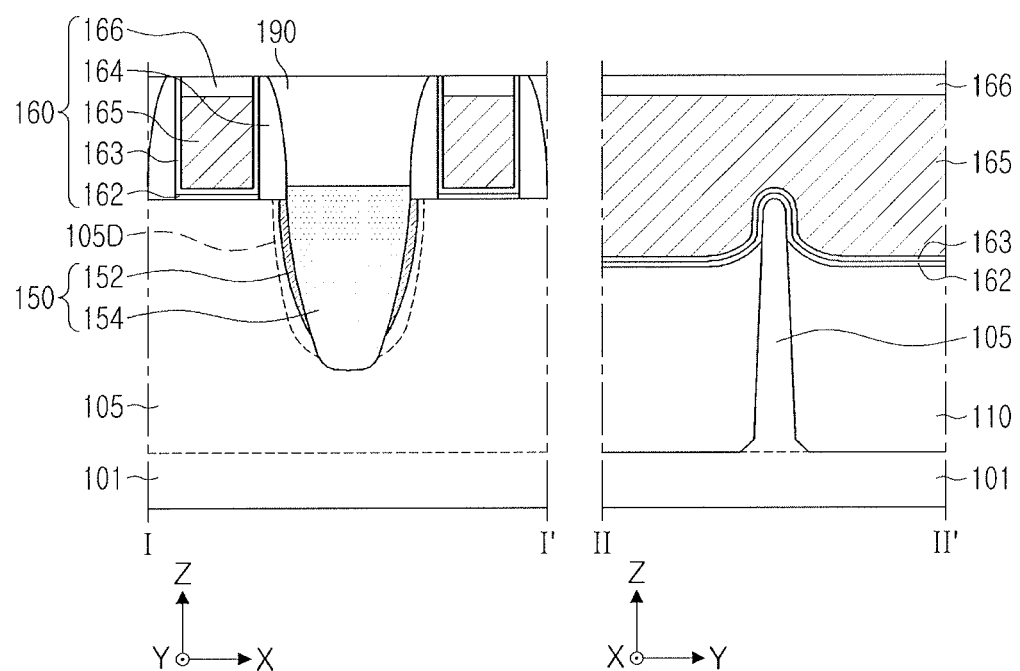

Referring to FIG. 6G, a gate structure 160 may be formed by forming first and second gate dielectric layers 162 and 163, the gate electrode 165, and the gate capping layer 166 in the openings OR.

The first and second gate dielectric layers 162 and 163 may be conformally formed along side walls and bottom surfaces of the openings substantially. Each of the first and second gate dielectric layers 162 and 163 may include an oxide, a nitride, or a high-k material. The gate electrode 165 may fill internal spaces of the first and second gate dielectric layers 162 and 163. The gate electrode 165 may include a metal or a semiconductor material.

After the first and second gate dielectric layers 162 and 163 and the gate electrode 165 are formed, a material remaining on the interlayer insulating layer 190 may be removed using a planarizing process such as a chemical mechanical polishing (CMP) process.

Referring back to FIG. 2, a contact plug 180 may be formed.

A contact hole may be formed by patterning the interlayer insulating layer 190, and the contact plug 180 may be formed by filling the contact hole with a conductive material. The contact hole may be formed by removing the interlayer insulating layer 190 on both side regions of the gate structure 160 using a mask layer such as a photoresist pattern. A lower surface of the contact hole may have a curvature formed along upper surfaces of the source/drain regions 150. When removing the interlayer insulating layer 190, an upper portion of the source/drain region 150 may be partially recessed. In example embodiments, a shape and a position of the contact plug 180 may be varied.

Figure 7:
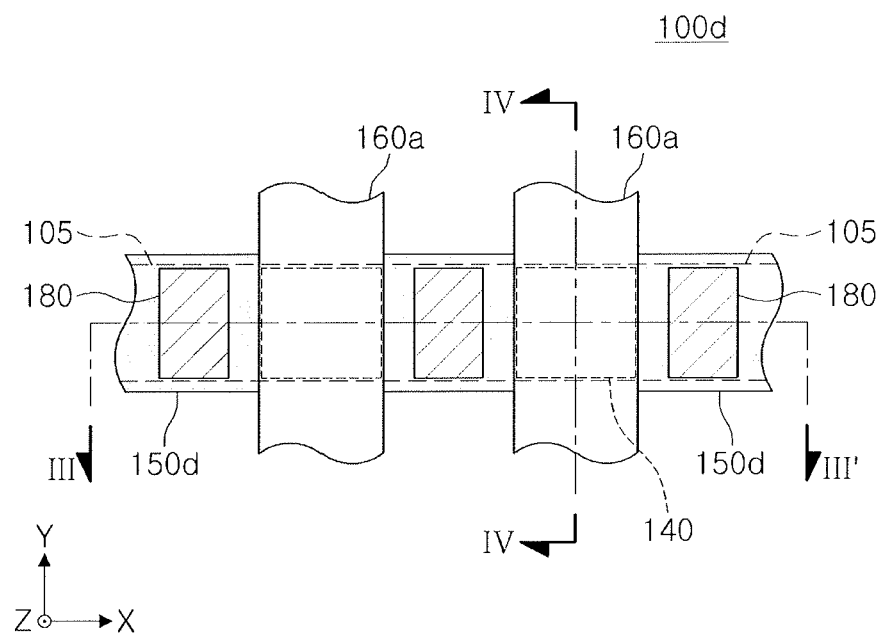
FIG. 7 illustrates a plan view of a semiconductor device according to an example embodiment.

FIG. 7 illustrates a plan view of a semiconductor device according to an example embodiment.

Figure 8:
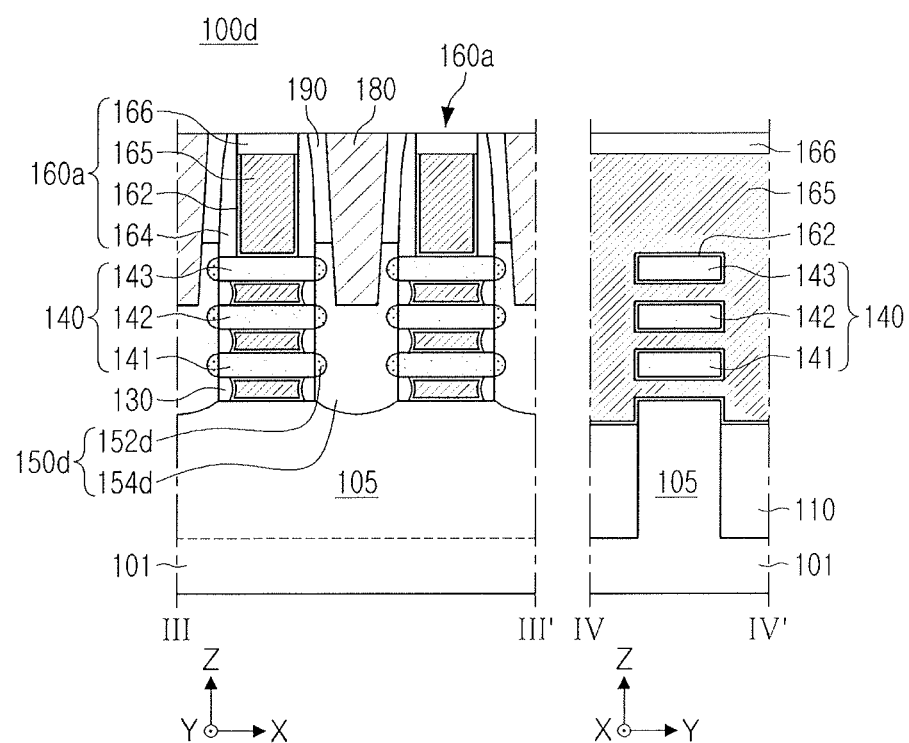
FIG. 8 illustrates a cross-sectional view of a semiconductor device according to an example embodiment.

FIG. 8 illustrates a cross-sectional view of a semiconductor device according to an example embodiment. FIG. 8 illustrates cross-sectional views of a semiconductor device illustrated in FIG. 7 taken along lines and IV-IV'. For ease of description, only main elements of the semiconductor device are illustrated in FIGS. 7 and 8.

Referring to FIGS. 7 and 8, a semiconductor device 100d may include a substrate 101, an active region 105 on the substrate 101, channel structures 140 (including a plurality of channel layers 141, 142, and 143 in the active region 105 and spaced apart from each other vertically, e.g., in the z direction), source/drain regions 150d in contact with the plurality of channel layers 141, 142, and 143, gate structures 160a intersecting the active region 105, and contact plugs 180 connected to the source/drain regions 150d. The semiconductor device 100d may further include device isolating layers 110, internal spacer layers 130, and interlayer insulating layers 190. The gate structures 160a may include a gate dielectric layer 162, a gate electrode 165, spacer layers 164, and a gate capping layer 166.

In the semiconductor device 100d, the active region 105 may have a fin structure, and the gate electrode 165 may be between the active region 105 and the channel structure 140, and among the plurality of channel layers 141, 142, and 143 of the channel structure 140. For example, the semiconductor device 100d may include a gate-all-around type field effect transistor formed by the channel structures 140, the source/drain regions 150d, and the gate structures 160a. The transistor may be, e.g., an NMOS transistor. In the description below, the same reference numerals in FIGS. 1 and 2 indicate the same elements, and overlapping descriptions may not be provided.

The channel structure 140 may include two or more channel layers, the first to third channel layers 141, 142, and 143, spaced apart from each other in a direction perpendicular to an upper surface of the active region 105, e.g., the z direction, in the active region 105. The first to third channel layers 141, 142, and 143 may be connected to the source/drain region 150d, and may be spaced apart from an upper surface of the active region 105. The first to third channel layers 141, 142, and 143 may have a width the same as or similar to a width of the active region 105 in the y direction, and may have a width the same as or similar to a width of the gate structure 160a in the x direction. In an implementation, the first to third channel layers 141, 142, and 143 may also have a reduced width such that side surfaces of the first to third channel layers 141, 142, and 143 are in or under a lower portion of the gate structure 160a in the x direction.

The first to third channel layers 141, 142, and 143 may be formed of a semiconductor material. For example, the first to third channel layers 141, 142, and 143 may include at least one of silicon (Si), germanium (SiGe), and silicon-germanium (Ge). The first to third channel layers 141, 142, and 143 may be formed of, e.g., a same material as a material of the substrate 101. The numbers and shapes of the channel layers 141, 142, and 143 included in a single channel structure 140 may be varied in example embodiments. In an implementation, another channel layer may be in a region in which the active region 105 is in contact with the gate electrode 165.

The source/drain regions 150d may be in the active region 105 on both side regions of the channel structure 140. The source/drain region 150d may include first epitaxial layers 152d on side surfaces of the first to third channel layers 141, 142, and 143 of the channel structure 140, respectively, and a second epitaxial layer 154d filling spaces between the first epitaxial layers 152d. The first epitaxial layers 152d and the second epitaxial layer 154d may be semiconductor layers including silicon (Si), and may include different types and/or different concentrations of impurities.

The first epitaxial layer 152d may be a region including a higher concentration of impurities than a concentration of impurities included in the active region 105. In an implementation, the first epitaxial layer 152d may include, e.g., arsenic (As) and/or phosphorus (P), and may be, e.g., a SiAs layer, a SiP layer, a SiPC layer, a SiC layer, a SiPAs layer, or a SiGeP layer. The first epitaxial layers 152 may be epitaxially grown from the first to third channel layers 141, 142, and 143, and may be on both side surfaces of the channel structure 140 (in or relative to the x direction). The first epitaxial layer 152d may not be on or at bottom surfaces of the source/drain regions 150d. In an implementation, a thickness of the first epitaxial layers 152d may be, e.g., about 4 nm to about 8 inn. The first epitaxial layers 152d may be on both side surfaces of the channel structure 140, and a short channel effect occurring by diffusion of impurities included in the second epitaxial layer 154d may be effectively prevented.

The first epitaxial layers 152d may be separated from each other among the plurality of channel layers 141, 142, and 143 disposed vertically in the z direction. The first epitaxial layers 152d may protrude (e.g., towards the second epitaxial layer 154d) from a side surface formed by the internal spacer layers 130 and the first to third channel layers 141, 142, and 143. The first epitaxial layers 152d may not overlap the internal spacer layers 130 on a plane (e.g., when viewed in the z direction).

The second epitaxial layer 154d may completely fill a region between adjacent channel structures 140, may surround a surface of the first epitaxial layer 152d on which the first epitaxial layer 152d is not in contact with the channel structure 140, and may cover side surfaces of the internal spacer layers 130. The second epitaxial layer 154d may fill a space between the first epitaxial layers 152d spaced apart from each other upwardly and downwardly (e.g., in the z direction). For example, at least a portion of the second epitaxial layer 154d may overlap the first epitaxial layers 152d on a plane (e.g., when viewed in the z direction).

The second epitaxial layer 154d may be a region including impurities in a concentration that is higher than a concentration of impurities included in the first epitaxial layer 152d. The second epitaxial layer 154d may be epitaxially grown from the first epitaxial layers 152d. The impurities included in the second epitaxial layer 154d may be the same as or different from impurities included in the first epitaxial layer 152d. For example, the second epitaxial layer 154d may be an SiP layer including phosphorus (P). In an implementation, the first epitaxial layer 152d may be an SiAs epitaxial layer, and the second epitaxial layer 154d may be an SiP epitaxial layer.

The impurities of the second epitaxial layer 154d may be partially diffused into an adjacent first epitaxial layer 152d and may be partially included in the first epitaxial layer 152d in a concentration that is lower than a concentration of impurities included in the second epitaxial layer 154d. In an implementation, the impurities of the first epitaxial layer 152d may be partially diffused into an adjacent second epitaxial layer 154d and may be partially included in the second epitaxial layer 154d in a relatively low concentration. The first epitaxial layer 152d and the second epitaxial layer 154d may be epitaxial layers, and damage to a film caused by an ion implantation process if the first epitaxial layer 152d and the second epitaxial layer 154d were to be doping regions may be prevented, thereby improving electrical properties of the semiconductor device 100d.

In an implementation, in the semiconductor device 100d, the first epitaxial layer 152d may be partially removed from a central region of the source/drain region 150d in an extension direction of the active region 105 between adjacent gate structures 160a and channel structures 140, and the second epitaxial layer 154d may be formed. For example, a volume of the second epitaxial layer 154d (including a relatively high concentration of impurities) may increase in the source/drain region 150d, and the first epitaxial layer 152d (including a relatively low concentration of impurities) may be only on a side surface of the channel structure 140 in a relatively low volume, thereby improving electrical properties of the semiconductor device 100d. In an implementation, the first epitaxial layer 152d may not remain in the central region adjacent to a side surface of the first channel layer 141 in a lowermost portion, and an electrical function of the first channel layer 141 may be secured.

In an implementation, the source/drain regions 150d may further include at least one doping region in the first to third channel layers 141, 142, and 143 in an internal region of the first epitaxial layers 152d, such as the doping region 105D of the semiconductor device 100 in the example embodiments illustrated in FIGS. 1 and 2.

The gate structure 160a may intersect the active region 105 and the channel structures 140 and to extend in one direction, e.g., the y direction, in upper portions of the active region 105 and the channel structures 140. Channel regions of transistors may be formed in the active region 105 and the channel structures 140 intersecting the gate structure 160a. The gate structure 160a may include a gate electrode 165, a gate dielectric layer 162 between the gate electrode 165 and the plurality of channel layers 141, 142, and 143, gate spacer layers 164 on side surfaces of the gate electrode 165, and a gate capping layer 166 on an upper surface of the gate electrode 165.

The gate dielectric layer 162 may be between the active region 105 and the gate electrode 165 and between the channel structure 140 and the gate electrode 165, and may cover at least portions of surfaces of the gate electrode 165. For example, the gate dielectric layer 162 may surround overall surfaces of the gate electrode 165 other than an uppermost surface. In an implementation, the gate dielectric layer 162 may extend to a region between the gate electrode 165 and the gate spacer layers 164. The gate dielectric layer 162 may include, e.g., an oxide, a nitride, or a high-k material.

The gate electrode 165 may fill a space among or between the plurality of channel layers 141, 142, and 143 and may extend to an upper portion of the channel structure 140 in an upper portion of the active region 105. The gate electrode 165 may be spaced apart from the plurality of channel layers 141, 142, and 143 by the gate dielectric layer 162. The gate electrode 165 may include a conductive material. In an implementation, the gate electrode 165 may include, e.g., a metal nitride material such as a titanium nitride film (TiN), a tantalum nitride film (TaN), or a tungsten nitride film (WN) and/or a metal material such as aluminum (Al), tungsten (W), molybdenum (Mo), or the like, or a semiconductor material such as a doped polysilicon. The gate electrode 165 may include multiple layers, e.g., two or more layers. The gate electrodes 165 may be separated from each other by a separating portion between at least portions of adjacent transistors depending on a configuration of the semiconductor device 100d.

The internal spacer layers 130 may be side by side with the gate electrode 165 between the channel structures 140. In a lower portion of the third channel layer 143, the gate electrode 165 may be spaced apart from and electrically isolated from the source/drain region 150d by the internal spacer layers 130. In an implementation, a side surface of the internal spacer layers 130 facing the gate electrode 165 may have an internally curved shape, curved inwardly towards the gate electrode 165. The internal spacer layers 130 may be formed of, e.g., an oxide, a nitride, and an oxynitride, and may be formed of a low-k material.

The contact plug 180 may penetrate the interlayer insulating layer 190 and may extend vertically (e.g., in the z direction) from an upper portion to a lower portion. In an implementation, the contact plug 180 may extend more downwardly (e.g., closer to the substrate 101) than the third channel layer 143. In an implementation, the contact plug 180 may be recessed up to or extend to be level with an upper surface of the second channel layer 142. In an implementation, the contact plug 180 may not be recessed into the source/drain region 150d, and may be in contact with an upper surface (e.g., flat upper surface) of the source/drain region 150d.

Figure 9:
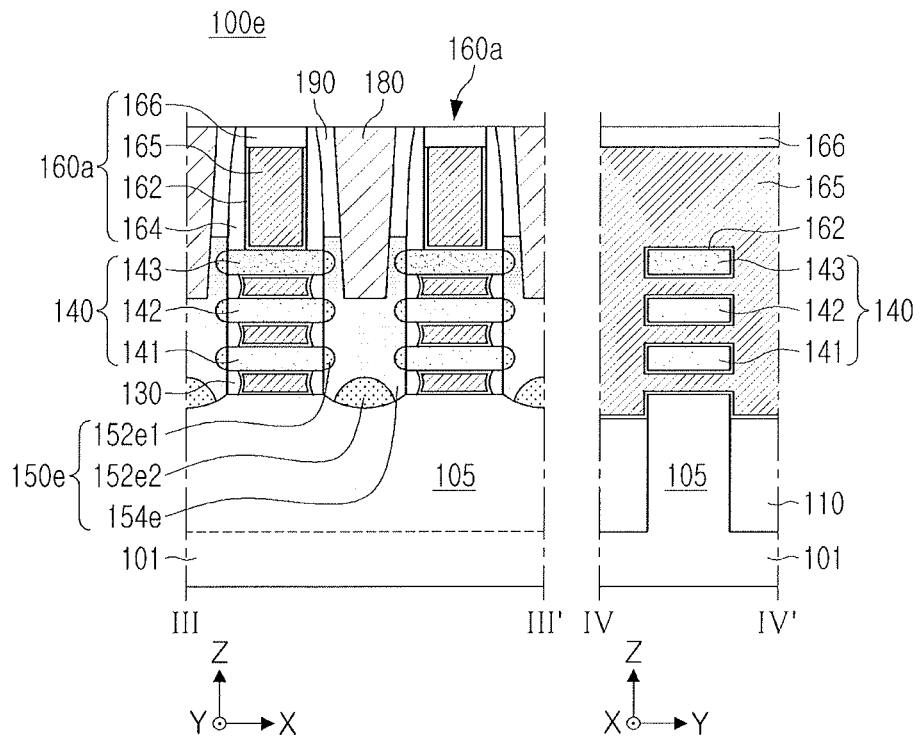
FIGS. 9 to 11 illustrate cross-sectional views of a semiconductor device according to an example embodiment.
Figure 10:
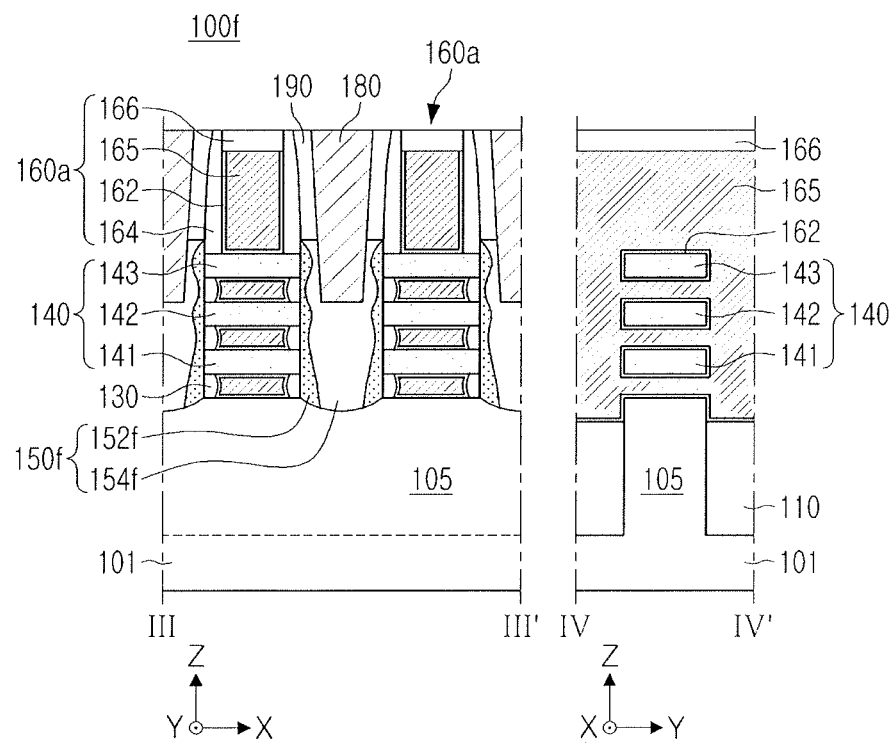
Figure 11:
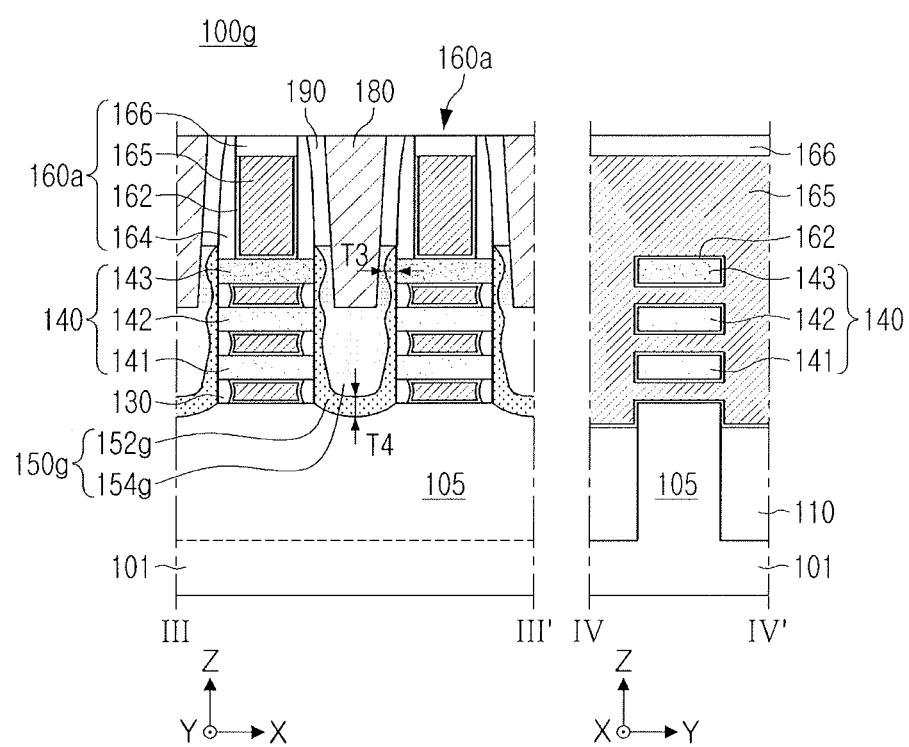

FIGS. 9 to 11 illustrate cross-sectional view of a semiconductor device according to an example embodiment. FIGS. 9 to 11 illustrate regions corresponding to the cross-sections taken along lines and IV-IV' in FIG. 7.

Referring to FIG. 9, a source/drain region 150e in a semiconductor device 100e may further include first side surface epitaxial layers 152e1 and a second epitaxial layer 154e, and may also include a first lower portion epitaxial layer 152e2 on a lower end of the source/drain region 150e.

The first lower portion epitaxial layer 152e2 may be formed together with the first side surface epitaxial layers 152e1 and may be formed of a same material as a material of the first side surface epitaxial layers 152e1. For example, the first lower portion epitaxial layer 152e2 may include at least one of SiAs, SiP, SiPC, SiC, SiGeAs, and SiGeP. The first lower portion epitaxial layer 152e2 may have a thickness that is greater than a thickness of the first side surface epitaxial layer 152e1 depending on a crystallographic plane of the active region 105. In an implementation, a width of an upper portion of the first lower portion epitaxial layer 152e2 may be narrower than a width of a lower portion, and the first lower portion epitaxial layer 152e2 may have an upwardly curved shape (e.g., a width of the first lower portion epitaxial layer 152e2 may decrease as a height relative to the substrate 101 increases). In an implementation, a lower surface of the source/drain region 150e may have a downwardly curved shape, and a shape of the first lower portion epitaxial layer 152e2 may be varied in example embodiments.

Referring to FIG. 10, in a source/drain region 150f in a semiconductor device 100f, first epitaxial layers 152f may (e.g., continuously) extend onto or along side surfaces of the plurality of channel layers 141, 142, and 143 of the channel structure 140 and also onto or along side surfaces of the internal spacer layers 130. The first epitaxial layers 152f may extend to a lower portion of the source/drain region 150f and may be in contact with the active region 105 on a lower end. In an implementation, the first epitaxial layers 152f may not remain in a central region in a lower end portion of a source/drain region 150f. The first epitaxial layer 152f may have a relatively great thickness on side surfaces of the plurality of channel layers 141, 142, and 143 of the source/drain region 150f, and may accordingly have curvatures.

Referring to FIG. 11, in a source/drain region 150g in a semiconductor device 100g, a first epitaxial layer 152g may (e.g., continuously) extend along side surfaces of the plurality of channel layers 141, 142, and 143 of the channel structure 140 and side surfaces of the internal spacer layers 130, and may form a lower surface of the source/drain region 150g on a lower end. For example, the first epitaxial layer 152g may completely surround a lower surface and side surfaces of a second epitaxial layer 154g (in the x direction). For example, the second epitaxial layer 154g may not directly contact the active region 105. In an implementation, the first epitaxial layer 152g may contact (e.g., directly contact) the gate spacer layers 164 on an upper end.

In an implementation, a thickness of the first epitaxial layer 152g may not be uniform. The first epitaxial layer 152g may have a third thickness T3 (e.g., measured in the x direction) on side walls of the plurality of channel layers 141, 142, and 143 and may have a fourth thickness T4 (e.g., measured in the z direction) that is greater than the third thickness T3 in a lower portion. In an implementation, the fourth thickness T4 may be two times or greater than two times the third thickness T3. The structure may be controlled by a crystallographic plane of the active region 105 in a lower portion of the source/drain region 150g. The first epitaxial layer 152g may have a relatively great thickness on side surfaces of the plurality of channel layers 141, 142, and 143 on both side regions of the source/drain region 150g (taken in the x direction), and may accordingly have curvatures. In an implementation, a shape of a lower surface of the source/drain region 150g may be varied. For example, a depth of the curved portion of the lower surface may be different. In an implementation, a shape of the first epitaxial layer 152g on a lower surface of the source/drain region 150g may also be varied.

Figure 12A:
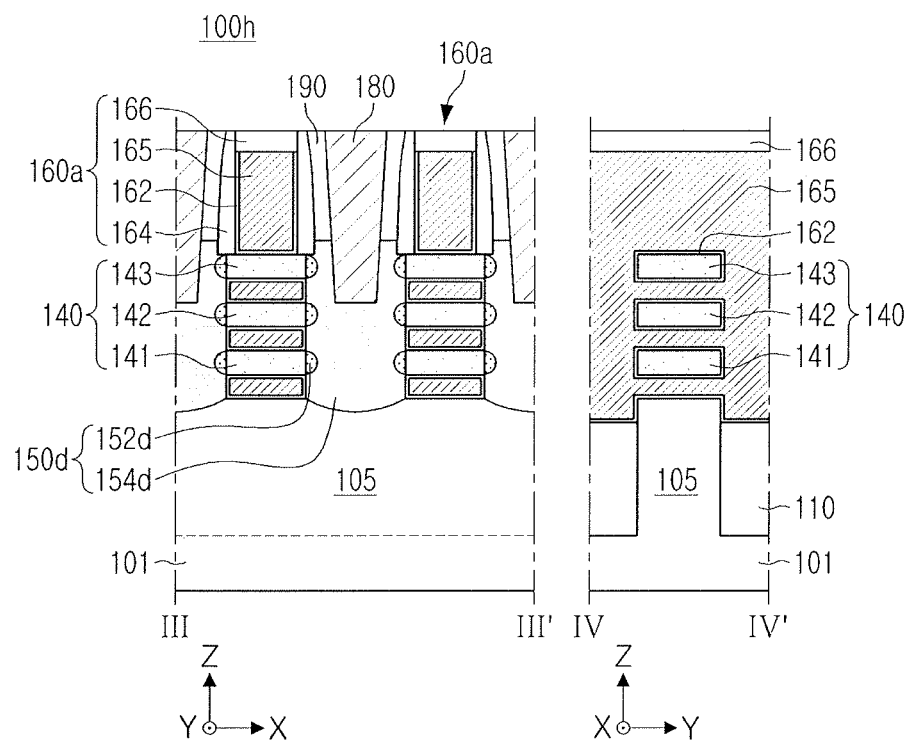
FIGS. 12A and 12B illustrate cross-sectional views of a semiconductor device according to an example embodiment.
Figure 12B:
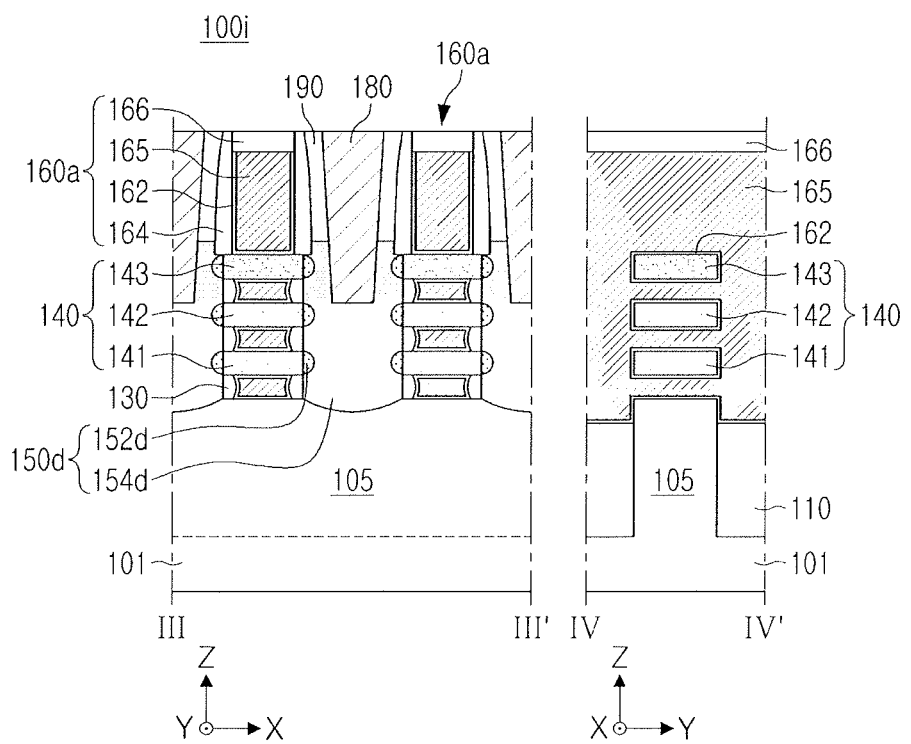

FIGS. 12A and 12B illustrate cross-sectional views of a semiconductor device according to an example embodiment. FIGS. 12A and 12B illustrate regions corresponding to the cross-sections taken along lines and IV-IV' in FIG. 7.

Referring to FIG. 12A, a semiconductor device 100h may not include an internal spacer layer 130 differently from the aforementioned example embodiment described with reference to FIG. 8. A gate electrode 165 may expand or extend outwardly in the x direction among or between a plurality of channel layers 141, 142, and 143 of a channel structure 140. For example, both side surfaces of the gate structures 160a (taken in the x direction) in a lower portion may be side by side (e.g., aligned in the z direction) with both side surfaces of the channel structure 140 upwardly and downwardly.

Referring to FIG. 12B, in a semiconductor device 100i, both side surfaces of the channel structures 140 and the internal spacer layers 130 (taken in the x direction) may be in (e.g., narrower than) lower portions of gate structures 160a, differently from the aforementioned example embodiment described with reference to FIG. 8. For example, the channel structure 140 may have a width (e.g., in the x direction) that is relatively smaller than a width of an upper portion of the gate structure 160a.

In an implementation, as illustrated in FIG. 12B, both side surfaces of the channel structures 140 and the internal spacer layers 130 (taken in the x direction) may be in or narrower than lower portions of gate spacer layers 164. In an implementation, the side surfaces may be in or aligned with a lower portion of the gate electrode 165.

Figure 13:
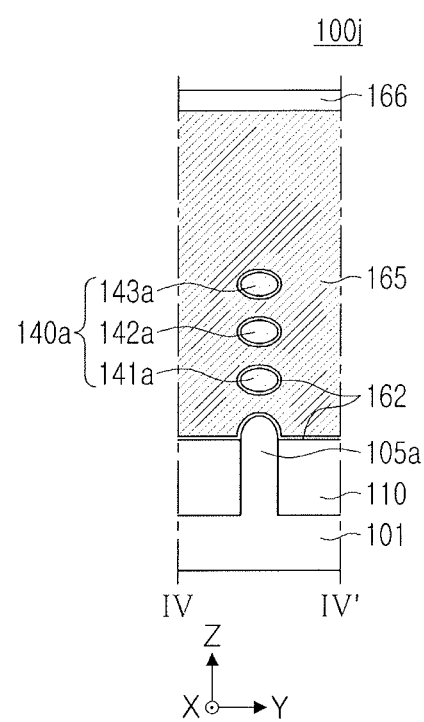
FIG. 13 illustrates a cross-sectional view of a semiconductor device according to an example embodiment.

FIG. 13 illustrates a cross-sectional view of a semiconductor device according to an example embodiment. FIG. 13 illustrates a region corresponding to the cross-section taken along line IV-IV' in FIG. 7.

Referring to FIG. 13, in a semiconductor device 100j, widths of an active region 105a and a channel structure 140a may be different from the example illustrated in FIG. 8. Each of the active region 105a and the channel structure 140a may have a relative small width, and accordingly, each of a plurality of channel layers 141a, 142a and 143a of the channel structure 140a may have a circular shape or an oval shape in which a difference between a major axis and a minor axis is relatively small on a cross-sectional view taken in the y direction. For example, in the example embodiment illustrated in FIG. 8, each of the plurality of channel layers 141, 142, and 143 may have a width of about 20 nm to 50 nm in the y direction, and each of the plurality of channel layers 141a, 142a and 143a in the example embodiment may have a width of about 3 nm to 12 nm in the y direction. As described above, in example embodiments, widths and shapes of the active region 105a and the channel structure 140a may be varied.

FIGS. 14A to 14L illustrate sectional views of stages in a method of manufacturing a semiconductor device in order according to an example embodiment. FIGS. 14A to 14L illustrate an example embodiment of a method for manufacturing a semiconductor device illustrated in FIGS. 7 and 8, and illustrate cross-sections corresponding to the region illustrated in FIG. 8.

Figure 14A:
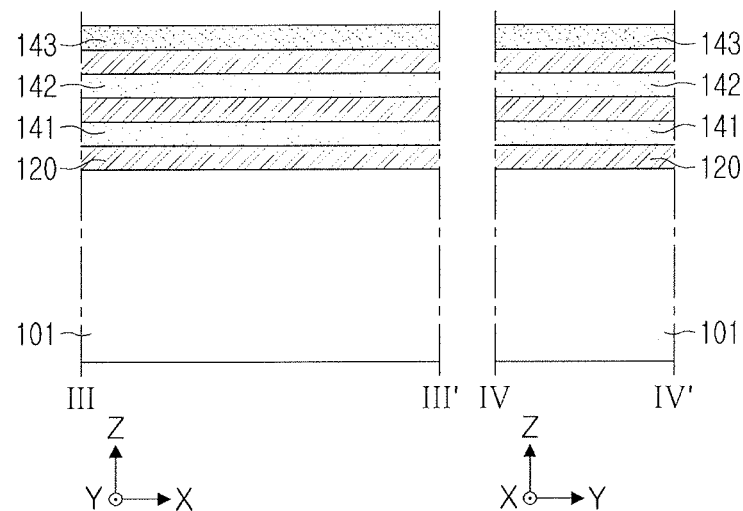
FIGS. 14A to 14L illustrate views of stages in a method of manufacturing a semiconductor device in order according to an example embodiment.

Referring to FIG. 14A, sacrificial layers 120 and a plurality of channel layers 141, 142, and 143 may be alternately layered on a substrate 101.

The sacrificial layers 120 may be replaced with a gate dielectric layer 162 and a gate electrode 165 through a subsequent process as illustrated in FIG. 7. The sacrificial layers 120 may be formed of a material having an etch selectivity with respect to the plurality of channel layers 141, 142, and 143. The plurality of channel layers 141, 142, and 143 may include a material different from a material of the sacrificial layers 120. For example, the sacrificial layers 120 and the plurality of channel layers 141, 142, and 143 may include a semiconductor material including at least one of silicon (Si), germanium (SiGe), and silicon-germanium (Ge) and may include different materials, and the sacrificial layers 120 and the plurality of channel layers 141, 142, and 143 may or may not include impurities. For example, the sacrificial layers 120 may include silicon-germanium (Ge), and the plurality of channel layers 141, 142, and 143 may include silicon (Si).

The sacrificial layers 120 and the plurality of channel layers 141, 142, and 143 may be formed by performing an epitaxial growth process using the substrate 101 as a seed. Each of the sacrificial layers 120 and the plurality of channel layers 141, 142, and 143 may have a thickness of about 1 Å to 100 nm. The number of layers of the plurality of channel layers 141, 142, and 143 alternately layered with the sacrificial layers 120 may be varied in example embodiments.

Figure 14B:
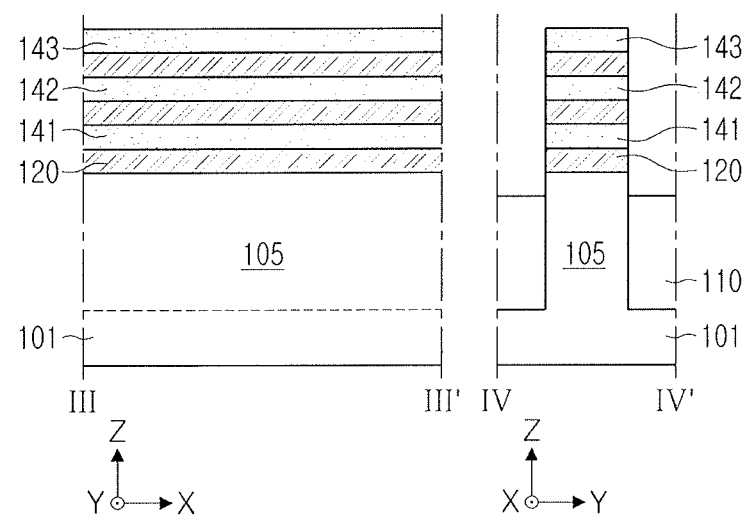

Referring to FIG. 14B, active structures may be formed by removing a stack structure of the sacrificial layers 120 and the plurality of channel layers 141, 142, and 143 and a portion of the substrate 101.

The active structure may include the sacrificial layers 120 and the plurality of channel layers 141, 142, and 143, alternately layered, and may further include an active region 105 protruding onto or from an upper surface of the substrate 101 by removing a portion of the substrate 101. The active structures may have a line form extending in one direction, e.g., the x direction, and may be spaced apart from each other in the y direction.

In the region from which a portion of the substrate 101 is removed, device isolating layers 110 may be formed by filling the region with an insulating material and configuring the insulating material to be recessed to allow the active region 105 to protrude. Upper surfaces of the device isolating layers 110 may be positioned lower than (e.g., closer to the substrate 101 in the z direction than) an upper surface of the active region 105.

Figure 14C:
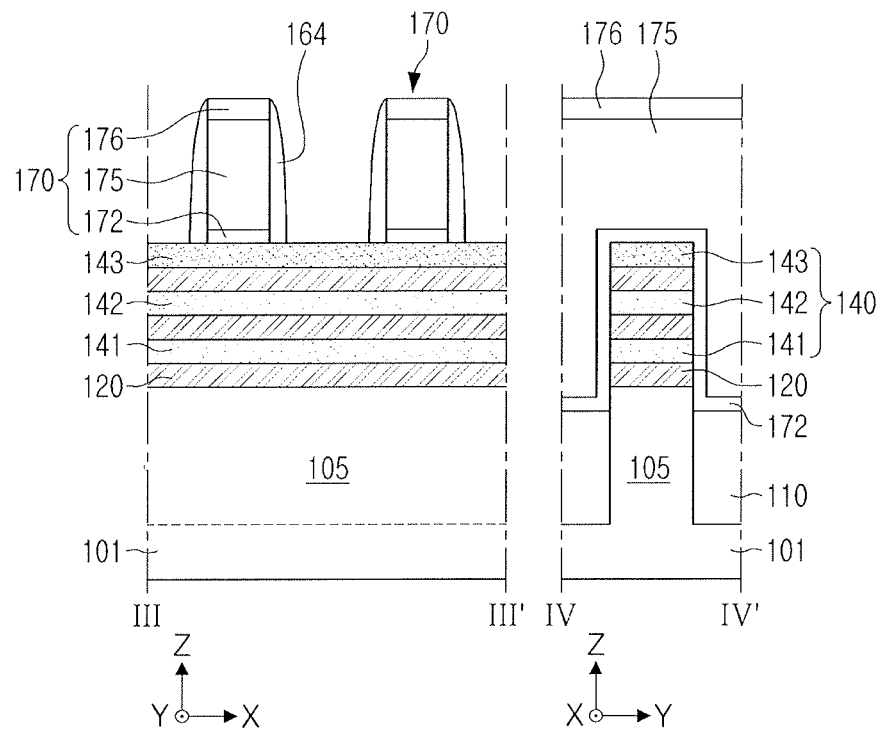

Referring to FIG. 14C, sacrificial gate structures 170 and gate spacer layers 164 may be formed on the active structures.

The sacrificial gate structures 170 may be sacrificial structures formed in a region in which the gate dielectric layer 162 and the gate electrode 165 are to be in upper portions of the channel structures 140 through a subsequent process as illustrated in FIG. 8. The sacrificial gate structures 170 may include first and second sacrificial gate layers 172 and 175, sequentially layered, and a mask pattern layer 176. The first and second sacrificial gate layers 172 and 175 may be patterned using the mask pattern layer 176. In an implementation, the first and second sacrificial gate layers 172 and 175 may be, e.g., an insulating layer and a conductive layer, respectively. The first and second sacrificial gate layers 172 and 175 may be integrated as a single layer. In an implementation, the first sacrificial gate layer 172 may include a silicon oxide, and the second sacrificial gate layer 175 may include a poly silicon. The mask pattern layer 176 may include a silicon oxide and/or a silicon nitride. The sacrificial gate structures 170 may have a line form intersecting the active structures and extending in one direction. In an implementation, the sacrificial gate structures 170 may extend in the y direction, and may be spaced apart from each other in the x direction.

The gate spacer layers 164 may be on both side walls of the sacrificial gate structures 170. The gate spacer layers 164 may be formed by forming a film having a uniform thickness along upper surfaces and side surfaces of the sacrificial gate structures 170 and the active structures and performing an anisotropic etching process. The gate spacer layers 164 may be formed of a low-k material, and may include at least one of SiO, SiN, SiCN, SiOC, SiON, and SiOCN.

Figure 14D:
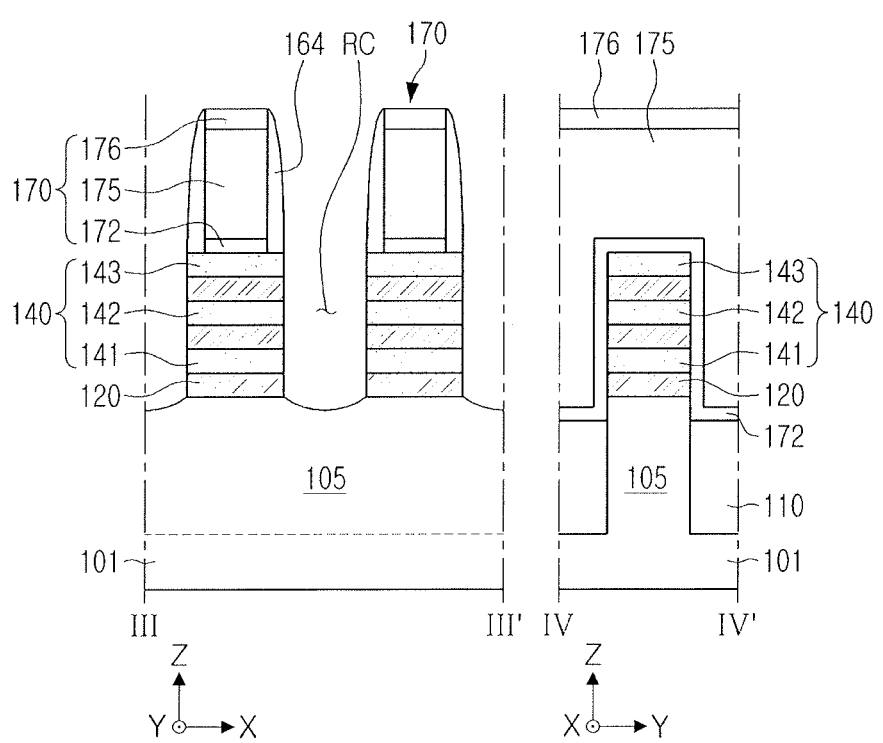

Referring to FIG. 14D, a recess region RC may be formed by removing exposed sacrificial layers 120 and a plurality of channel layers 141, 142, and 143 between the sacrificial gate structures 170, thereby forming channel structures 140.

The exposed sacrificial layers 120 and the plurality of channel layers 141, 142, and 143 may be removed using the sacrificial gate structures 170 and the gate spacer layers 164 as masks. For example, each of the plurality of channel layers 141, 142, and 143 may have a limited length in the x direction and may form the channel structure 140. In an implementation, as illustrated in FIG. 12D, the sacrificial layers 120 and the channel structure 140 may be partially removed from side surfaces of the sacrificial gate structures 170 in lower portions of the sacrificial gate structures 170, and both side surfaces taken in the x direction may be in lower portions of the sacrificial gate structures 170 and the gate spacer layers 164.

Figure 14E:
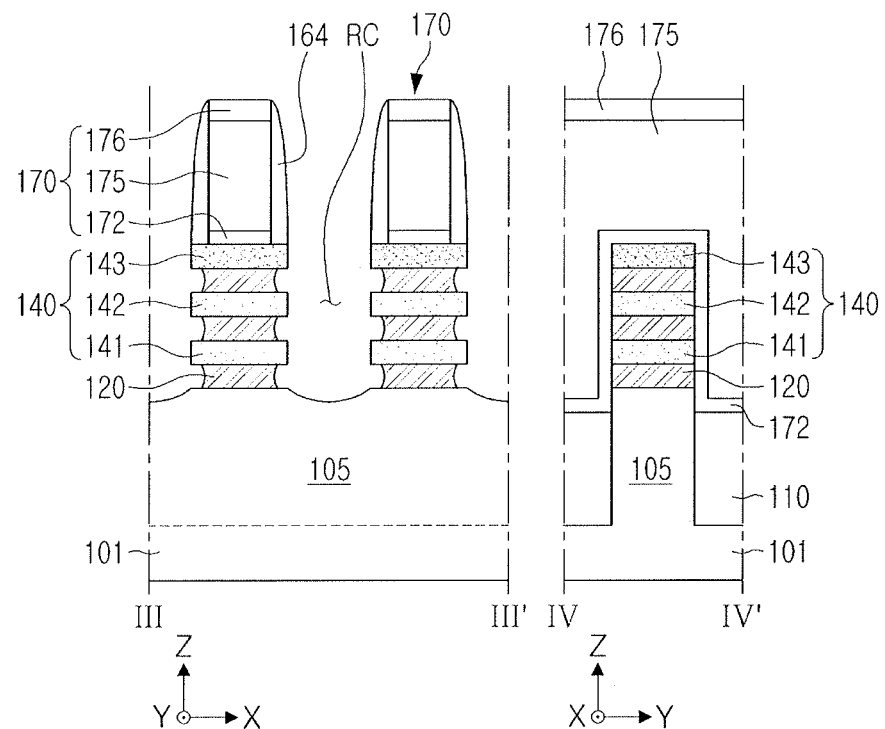

Referring to FIG. 14E, the exposed sacrificial layers 120 may be partially removed from a side surface.

The sacrificial layers 120 may be selectively etched with reference to the channel structures 140 by a wet etching process and may be removed by a certain depth from the side surface taken in the x direction. In an implementation, the sacrificial layers 120 may have inwardly recessed side surfaces by the side surface etching process as described above. In an implementation, the shapes of the side surfaces of the sacrificial layers 120 may vary.

Figure 14F:
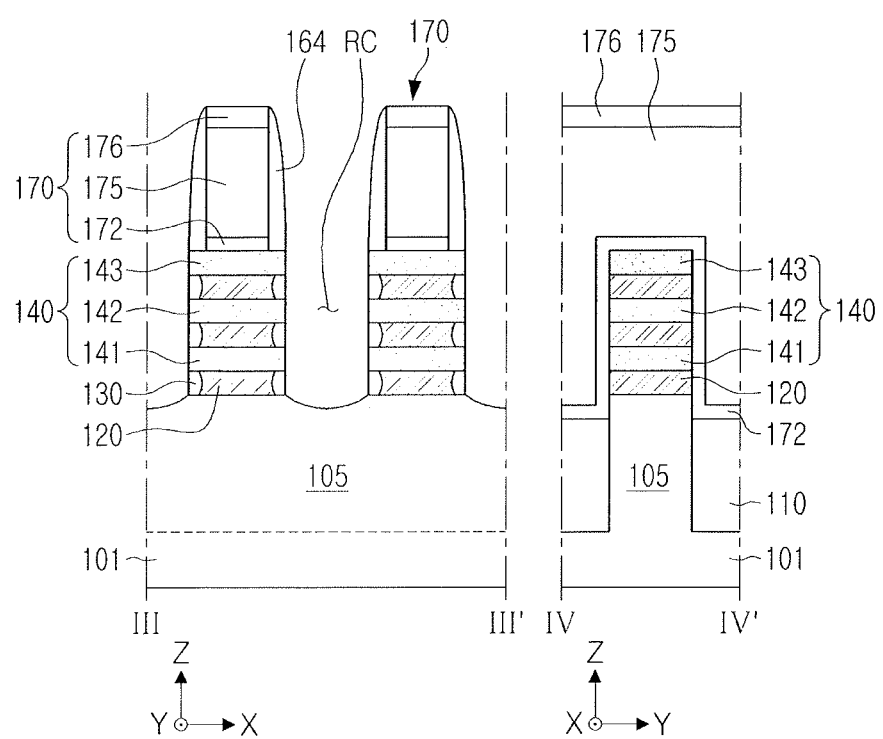

Referring to FIG. 14F, internal spacer layers 130 may be formed in the region from which the sacrificial layers 120 have been removed.

The internal spacer layers 130 may be formed by filling the region from which the sacrificial layers 120 have been removed with an insulating material, and removing the insulating material from external regions of the channel structures 140. In an implementation, the internal spacer layers 130 may be formed of a same material as the gate spacer layers 164. In an implementation, the internal spacer layers 130 may include at least one of SiN, SiCN, SiOCN, SiBCN, and SiBN.

Figure 14G:
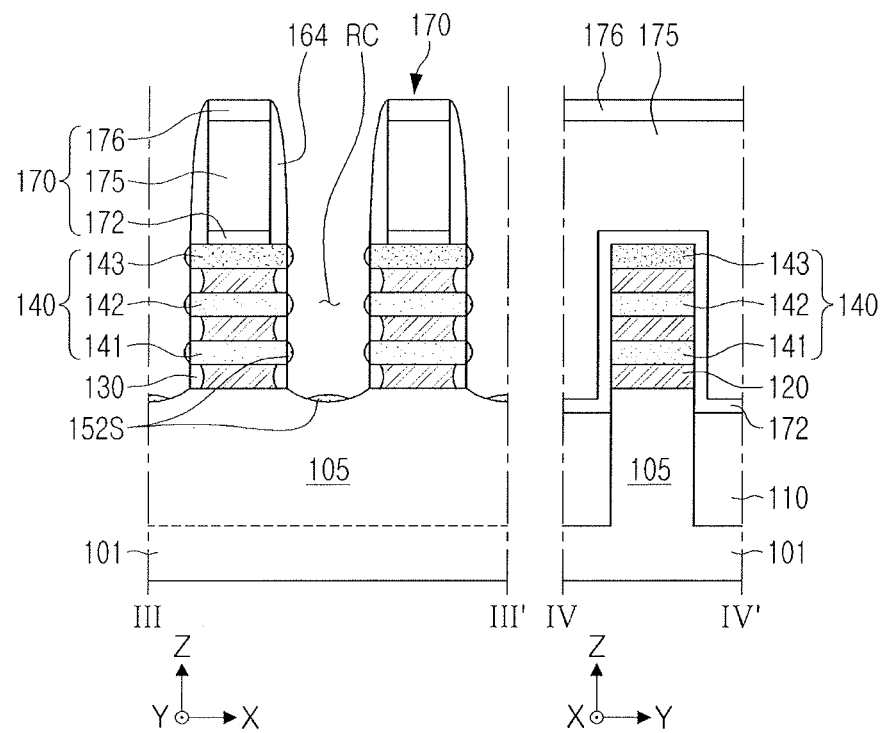

Referring to FIG. 14G, a seed layer 152S (for forming source/drain regions 150d) may be formed in the recess region RC on both side regions or sides of the sacrificial gate structures 170.

The seed layer 152S may be formed on side surfaces of the first to third channel layers 141, 142, and 143 by an SEG process, and may also be formed in the active region 105 on a bottom surface of the recess region RC. The seed layer 152S may include impurities in a concentration that is lower than a concentration of impurities included in the first and second epitaxial layers 152d and 154d to be formed in a subsequent process, or may not include impurities. For example, a growth of the first epitaxial layers 152d may be facilitated or a lattice mismatch may be reduced by the seed layer 152S. In an implementation, the process for forming the seed layer 152S may be omitted.

Figure 14H:
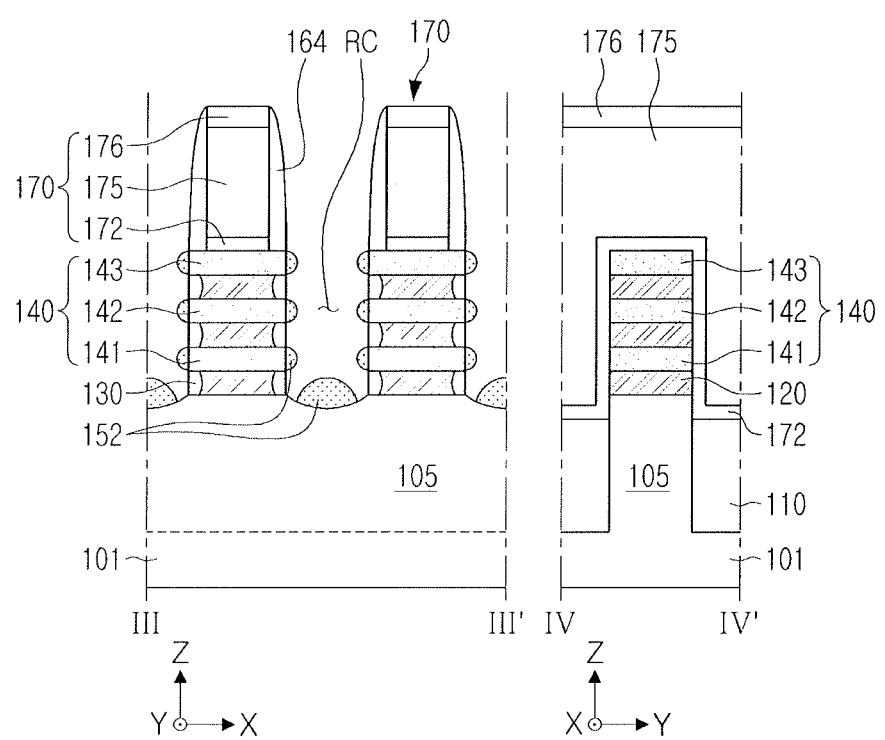

Referring to FIG. 14H, the first epitaxial layers 152d of the source/drain regions 150d may be formed in the recess region RC.

The first epitaxial layers 152d may be formed by an epitaxial growth from the seed layer 152S, and may include impurities by an in-situ doping process. The first epitaxial layers 152d may be an SiAs layer, an SiP layer, an SiPC layer, an SiC layer, an SiPAs layer, or an SiGeP layer. The first epitaxial layer 152d may be formed on the active region 105 on side surfaces of the first to third channel layers 141, 142, and 143 and on a bottom surface of the recess region RC. In an implementation, the first epitaxial layer 152d on the first to third channel layers 141, 142, and 143 may have externally curved surfaces (e.g., outwardly convex surfaces), curved from side surfaces of the first to third channel layers 141, 142, and 143. In an implementation, the first epitaxial layer 152d on a bottom surface of the recess region RC may have an upwardly curved or convex surface on a surface of the active region 105. In an implementation, as illustrated in FIGS. 10 and 11, the manufacturing process may be performed while controlling a growth speed and a growth thickness of the first epitaxial layer 152d in the above-described process.

Figure 14I:
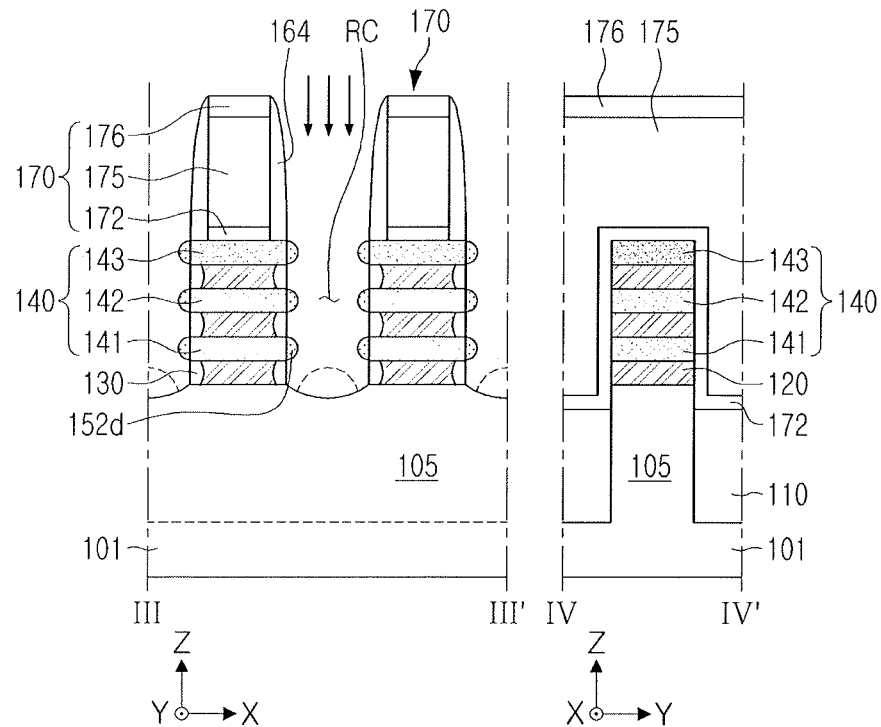

Referring to FIG. 14I, the first epitaxial layer 152d on the active region 105 (e.g., at the bottom of the recess region RC) may be removed between the sacrificial gate structures 170.

The process for removing the first epitaxial layer 152d may be performed using a mask layer or using the sacrificial gate structures 170 as masks without using another mask. As the removing process, e.g., a dry etching process may be used. For example, the first epitaxial layer 152d may be removed from a bottom surface of the recess region RC, and the active region 105 of the substrate 101 may be exposed. For example, the first epitaxial layer 152d may only be, e.g., may remain, on side surfaces of the first to third channel layers 141, 142, and 143. In an implementation, as illustrated in FIGS. 9 and 11, the above-described process may not be performed.

Figure 14J:
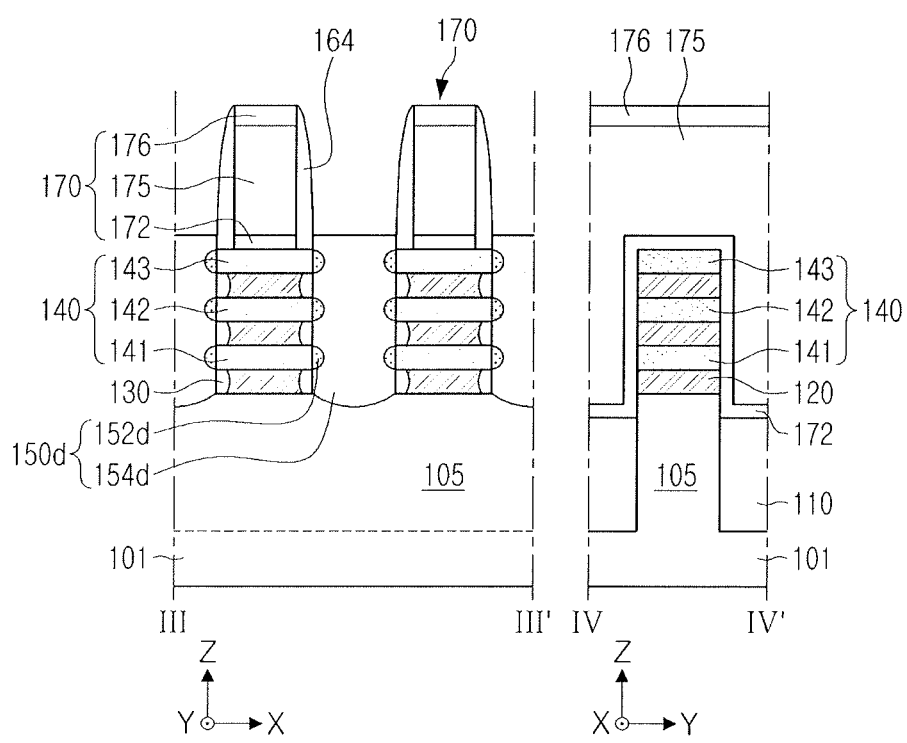

Referring to FIG. 14J, the second epitaxial layer 154d of the source/drain region 150d may be formed to fill the recess region RC.

The second epitaxial layer 154d may be grown from the first epitaxial layers 152d and the active region 105 using an SEG process, and may be formed as an in-situ doped semiconductor layer, e.g., an SiP layer. A concentration of phosphorus (P) included in the second epitaxial layer 154d may be higher than a concentration of arsenic (As) or phosphorus (P) included in the first epitaxial layers 152d. Accordingly, the source/drain region 150d may be formed.

The second epitaxial layer 154d may have a form similar to an oval along with the first epitaxial layer 152d, and an upper surface of the second epitaxial layer 154d may be planar. The second epitaxial layer 154d may fill a space between the first epitaxial layers 152d disposed upwardly and downwardly in the z direction, and may fill a space between the first epitaxial layers 152d on both side surfaces of the recess region RC in the x direction. The second epitaxial layer 154d may be in contact with the active region 105 in a central region of the source/drain regions 150d. The second epitaxial layer 154d may be formed after the first epitaxial layers 152d is removed from the central region of the source/drain regions 150d, a function of the first channel layer 141 as a channel region may be secured, and a volume of the second epitaxial layer 154d may relatively increase such that electrical properties of the semiconductor device may improve.

In the source/drain region 150d, the first and second epitaxial layers 152d and 154d may be epitaxially grown. For example, in the source/drain region 150d formed through the processes described above, a boundary between the first and second epitaxial layers 152d and 154d may not be distinct in a microscope image. Compositions of the first and second epitaxial layers 152d and 154d may be different from each other, and the first and second epitaxial layers 152d and 154d may be substantially distinguished from each other through an analysis such as a transmission electron microscopy energy-dispersive X-ray spectroscopy (TEM-EDX) analysis, and the like.

Figure 14K:
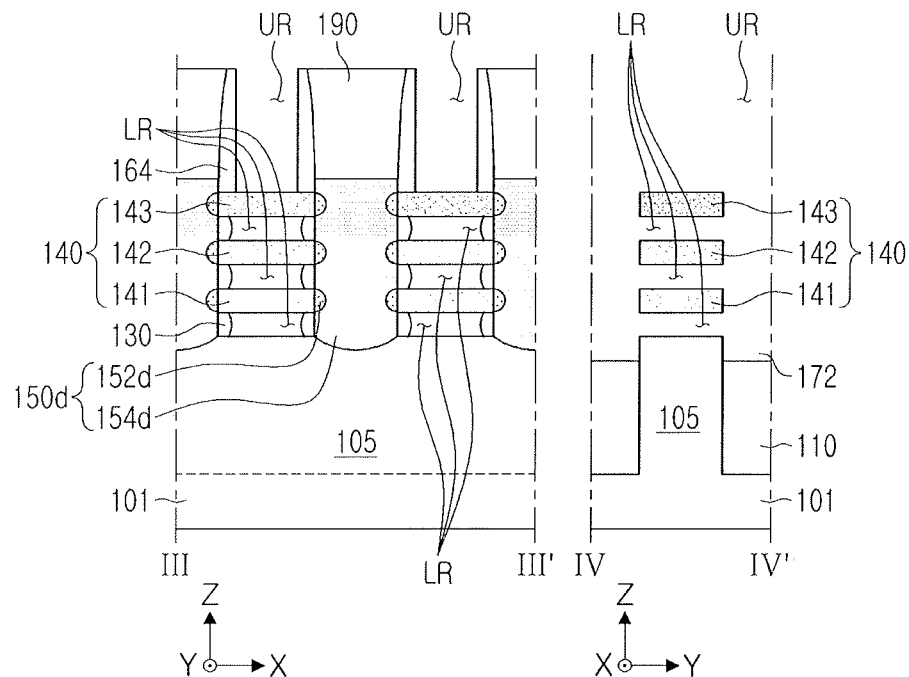

Referring to FIG. 14K, an interlayer insulating layer 190 may be formed, and the sacrificial layers 120 and the sacrificial gate structures 170 may be removed.

The interlayer insulating layer 190 may be formed by forming an insulating film covering the sacrificial gate structures 170 and the source/drain regions 150d and performing a planarization process.

The sacrificial layers 120 and the sacrificial gate structures 170 may be selectively removed with respect to the gate spacer layers 164, the interlayer insulating layer 190, and the channel structures 140. Upper gap regions UR may be formed by removing the sacrificial gate structures 170, and lower gap regions LR may be formed by removing the sacrificial layers 120 exposed through the upper gap regions UR. For example, when the sacrificial layers 120 include silicon-germanium (Ge), and the channel structure 140 includes silicon (Si), the sacrificial layers 120 may be selectively removed by performing a wet etching process using peracetic acid as an etchant. During the removing process, the source/drain regions 150d may be protected by the interlayer insulating layers 190 and the internal spacer layers 130.

Figure 14L:
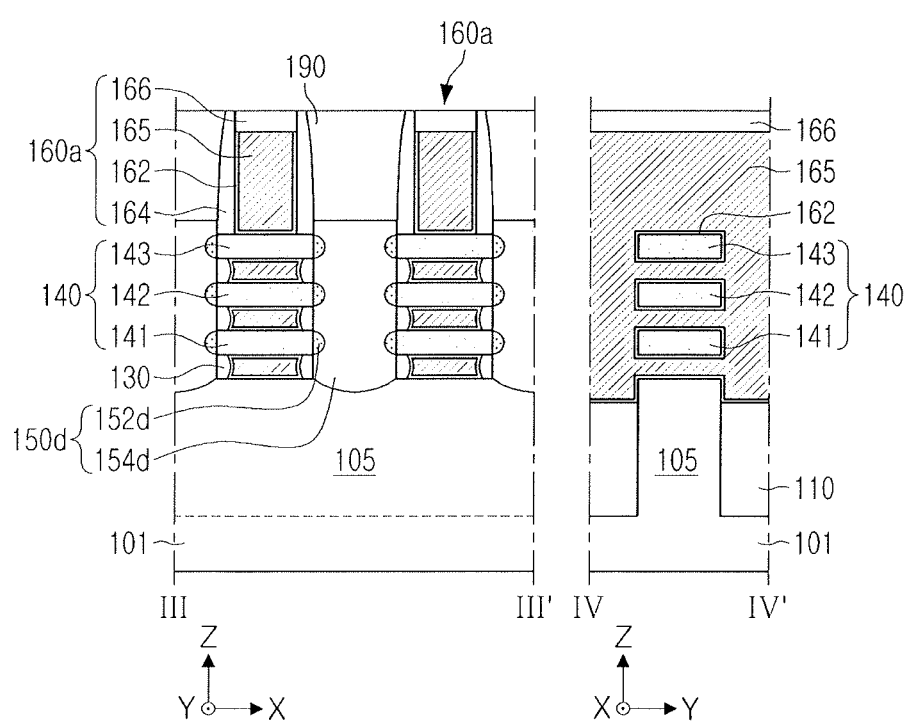

Referring to FIG. 14L, the gate structures 160a may be in the upper gap regions UR and the lower gap regions LR.

The gate dielectric layers 162 may conformally cover internal surfaces of the upper gap regions UR and the lower gap regions LR. The gate electrodes 165 may completely fill the upper gap regions UR and the lower gap regions LR, and may be removed by a certain depth from upper portions of the upper gap regions UR. A gate capping layer 166 may be formed in the region from which the gate electrodes 165 have been removed in the upper gap regions UR. For example, the gate structures 160a including the gate dielectric layer 162, the gate electrode 165, the gate spacer layers 164, and the gate capping layer 166 may be formed.

Referring back to FIG. 8, a contact plug 180 may be formed.

A contact hole may be formed by patterning the interlayer insulating layer 190, and the contact plug 180 may be formed by filling the contact hole with a conductive material. A lower surface of the contact hole may be recessed or extend into the source/drain regions 150d or may have flexures formed along upper surfaces of the source/drain regions 150d. In an implementation, a shape and a position of the contact plug 180 may be varied.

By way of summation and review, to overcome limitations in operational properties for a reduced size of a planar metal oxide semiconductor FET (MOSFET), a semiconductor device including a FinFET may have a three-dimensional channel.

According to the aforementioned example embodiments, by controlling the structure of the source/drain region, a semiconductor device having improved electrical properties may be provided.

One or more embodiments may provide a semiconductor device having improved electrical properties.

According to an embodiment, first impurities may include an element having a size greater than a size of an element of the second impurities. For example, the diffusion of the second impurities may be more effectively prevented, thereby preventing a short channel effect.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region extending in a first direction on a substrate;
a gate structure intersecting the active region and extending in a second direction on the substrate; and a source/drain region on the active region and at least one side of the gate structure, wherein the source/drain region includes:

a plurality of first epitaxial layers spaced apart from each other in the first direction, the plurality of first epitaxial layers including first impurities of a first conductivity type; and a second epitaxial layer filling a space between the plurality of first epitaxial layers, the second epitaxial layer including second impurities of the first conductivity type.

2. The semiconductor device as claimed in claim 1, wherein:

each of the plurality of first epitaxial layers includes the first impurities in a first concentration, and the second epitaxial layer includes the second impurities in a second concentration that is higher than the first concentration.

3. The semiconductor device as claimed in claim 1, wherein:

the first impurities include arsenic (As), and the second impurities include phosphorus (P).

4. The semiconductor device as claimed in claim 1, wherein:

the plurality of first epitaxial layers are SiAs layers, and the second epitaxial layer is an SiP layer.

5. The semiconductor device as claimed in claim 1, wherein:

the active region includes doping regions in contact with the plurality of first epitaxial layers, the doping regions including the first impurities, and the doping regions are spaced apart from each other in the first direction.

6. The semiconductor device as claimed in claim 5, wherein:

each of the plurality of first epitaxial layers include the first impurities in a first concentration, and each of the doping regions include the first impurities in a third concentration that is lower than the first concentration.

7. The semiconductor device as claimed in claim 1, wherein:

the active region includes a recess region recessed from an upper surface thereof on the at least one side of the gate structure, and the source/drain region is in the recess region.

8. The semiconductor device as claimed in claim 7, wherein:

the plurality of first epitaxial layers are on each of two side walls of the recess region, and the second epitaxial layer fills remaining parts of the recess region.

9. The semiconductor device as claimed in claim 1, wherein:

the plurality of first epitaxial layers further include the second impurities, and the second epitaxial layer further includes the first impurities.

10. The semiconductor device as claimed in claim 9, wherein a concentration of the first impurities in the plurality of first epitaxial layers, in the second epitaxial layer and in the active region has a maximum value in the plurality of first epitaxial layers.

11. The semiconductor device as claimed in claim 1, further comprising plurality of channel layers on the active region, the plurality of channel layers being spaced apart from each other in a third direction perpendicular to the first direction and the second direction, wherein the gate structure surrounds the plurality of channel layers.

12. The semiconductor device as claimed in claim 11, wherein the plurality of first epitaxial layers:

are on side surfaces of the plurality of channel layers, and are spaced apart from one another in the third direction.

13. The semiconductor device as claimed in claim 12, wherein the plurality of first epitaxial layers include:

first regions on the side surfaces of the plurality of channel layers, respectively, that are spaced apart from one another in the third direction, and a second region spaced apart from the first regions and on the active region at a lower end of the source/drain region.

14. The semiconductor device as claimed in claim 11, wherein the plurality of first epitaxial layers continuously extend along sides of the plurality of channel layers on the active region.

15. A semiconductor device, comprising:

an active region extending in a first direction on a substrate;

a plurality of channel layers on the active region, the plurality of channel layers being spaced apart from each other in a third direction perpendicular to the first direction;

a gate structure on the substrate intersecting the active region and the plurality of channel layers and extending in a second direction, the gate structure surrounding the plurality of channel layers; and a source/drain region on the active region and at least one side of the gate structure, the source/drain region being in contact with the plurality of channel layers, wherein the source/drain region includes:

a plurality of first epitaxial layers on side surfaces of the plurality of channel layers in the first direction, each of the plurality of first epitaxial layers including first impurities of a first conductivity type; and a second epitaxial layer filling a space between the plurality of first epitaxial layers and including second impurities of the first conductivity type.

16. The semiconductor device as claimed in claim 15, wherein the plurality of first epitaxial layers are spaced apart from one another in the third direction.

17. The semiconductor device as claimed in claim 16, wherein the second epitaxial layer extends between the plurality of first epitaxial layers that spaced apart from one another in the third direction.

18. The semiconductor device as claimed in claim 15, further comprising internal spacer layers on both sides of the gate structure on a lower surface of each of the plurality of channel layers, wherein the plurality of first epitaxial layers protrude in the first direction towards the second epitaxial layer relative to a side surface formed by the internal spacer layers and the channel layers.

19. A semiconductor device, comprising:

an active structure extending in a first direction on a substrate and having channel regions;

gate structures intersecting the channel regions and extending in a second direction; and source/drain regions on both sides of the gate structures, wherein each of the source/drain regions includes:

a first semiconductor layer including first impurities in a first concentration; and a plurality of second semiconductor layers separated from each other to be in contact with the channel regions, respectively, between the first semiconductor layer and the channel regions, and including second impurities in a second concentration that is lower than the first concentration.

20. The semiconductor device as claimed in claim 19, wherein the first impurities and the second impurities have a same conductivity type.

* * * * *